(12) United States Patent
Fujishiro et al.

(10) Patent No.: US 6,784,657 B2
(45) Date of Patent: Aug. 31, 2004

(54) HANDLING APPARATUS AND TEST SET USING THE HANDLING APPARATUS

(75) Inventors: Keiji Fujishiro, Aizuwakamatsu (JP); Yasunori Sato, Aizuwakamatsu (JP); Shigeyuki Maruyama, Kawasaki (JP); Naohito Kohashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/302,834

(22) Filed: Nov. 25, 2002

(65) Prior Publication Data

US 2003/0222636 A1 Dec. 4, 2003

(30) Foreign Application Priority Data

May 31, 2002 (JP) .......................................... 2002-158996

(51) Int. Cl.[7] .............................................. G01R 31/02

(52) U.S. Cl. ..................................... 324/158.1; 324/755

(58) Field of Search .................................. 324/754–758, 324/760–765, 158.1; 414/416.11, 422, 788.7

(56) References Cited

U.S. PATENT DOCUMENTS

| | | | |
|---|---|---|---|
| 5,172,049 A | * | 12/1992 | Kiyokawa et al. .......... 324/760 |
| 5,523,678 A | * | 6/1996 | Mitsui ...................... 324/158.1 |
| 5,920,192 A | * | 7/1999 | Kiyokawa ................. 324/158.1 |
| 6,369,595 B1 | * | 4/2002 | Farnworth et al. .......... 324/755 |
| 6,456,062 B2 | * | 9/2002 | Yamashita et al. ........ 324/158.1 |
| 6,462,534 B2 | * | 10/2002 | Kang et al. ............... 324/158.1 |

FOREIGN PATENT DOCUMENTS

| | | |
|---|---|---|
| JP | 2001-337131 | 12/2001 |
| JP | 2002-5990 | 1/2002 |

* cited by examiner

*Primary Examiner*—Minh N. Tang
(74) *Attorney, Agent, or Firm*—Armstrong, Kratz, Quintos, Hanson & Brooks, LLP.

(57) ABSTRACT

A handling apparatus includes a main unit, a holder configured to hold an object, a retainer configured to retain the holder so as to allow the holder to displace with respect to the main unit, and a latch unit configured to selectively bring the holder into a latched state, in which the displacement of the holder with respect to the main unit is restrained, or an unlatched state, in which the displacement of the holder with respect to the main unit is not restrained.

25 Claims, 22 Drawing Sheets

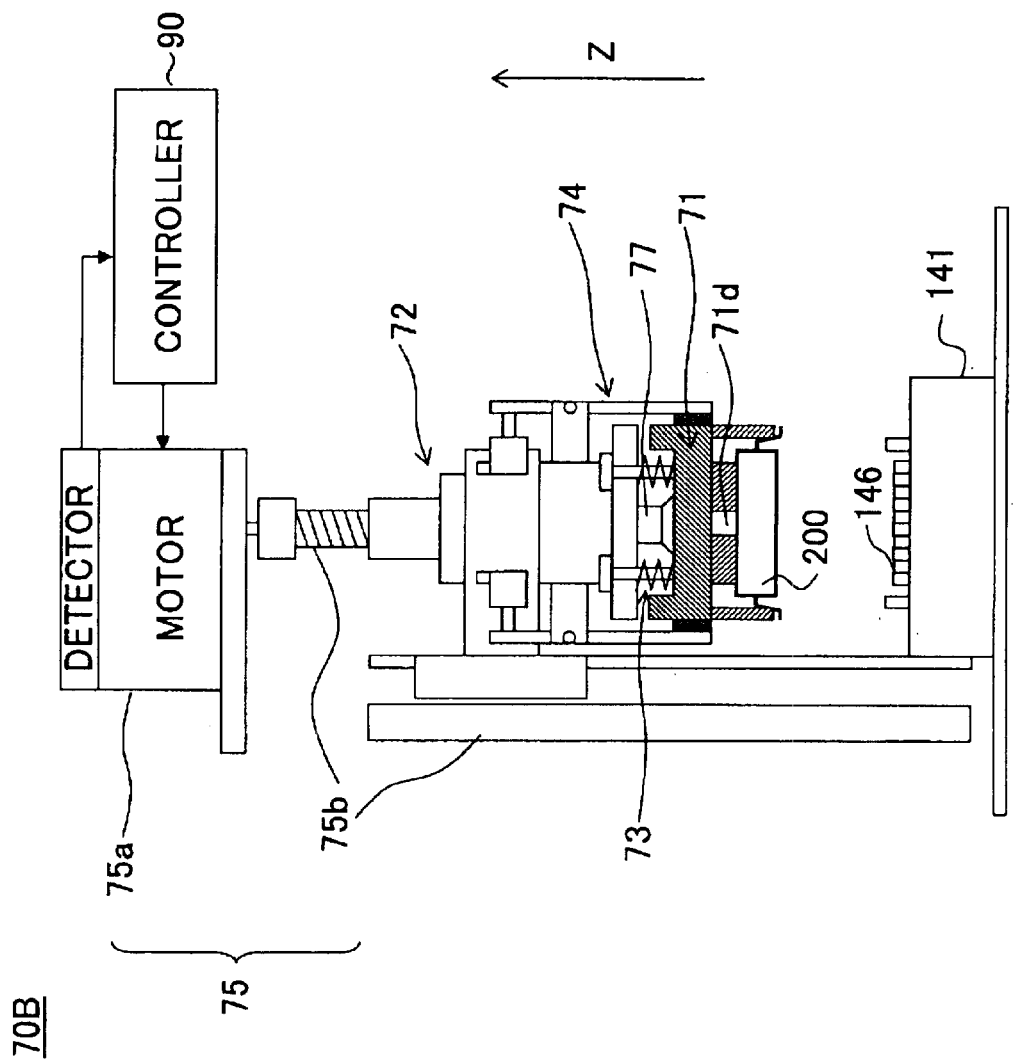

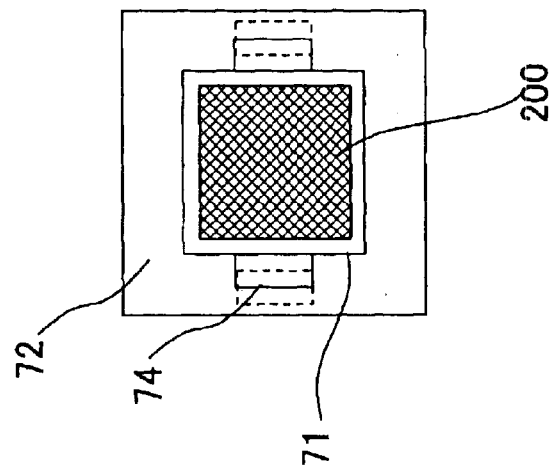
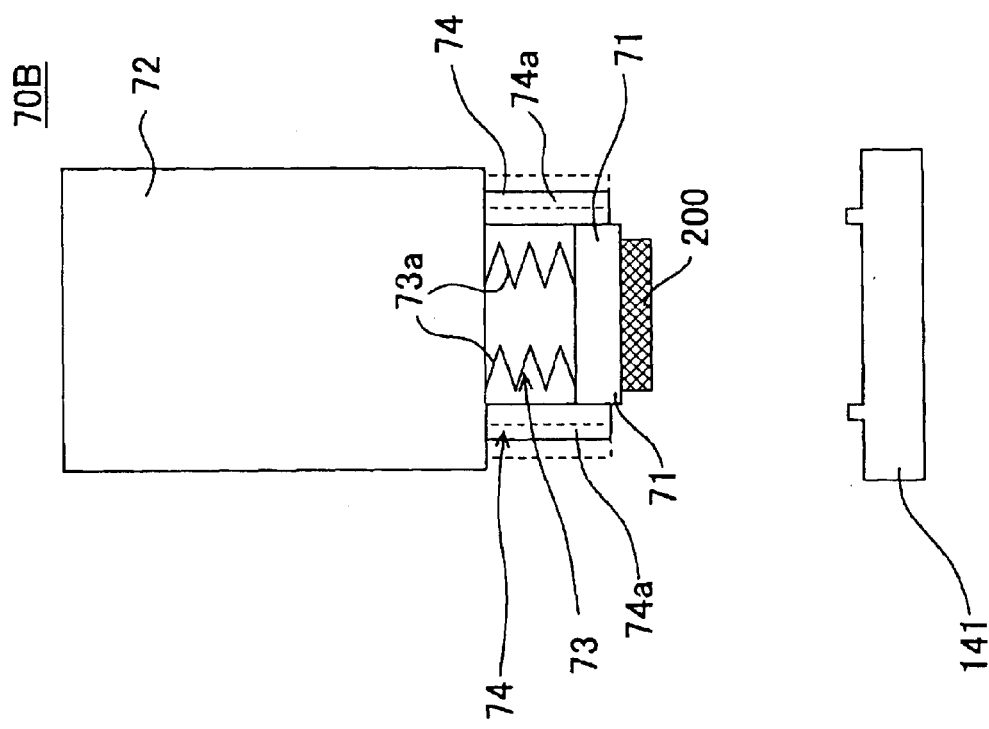

FIG.4
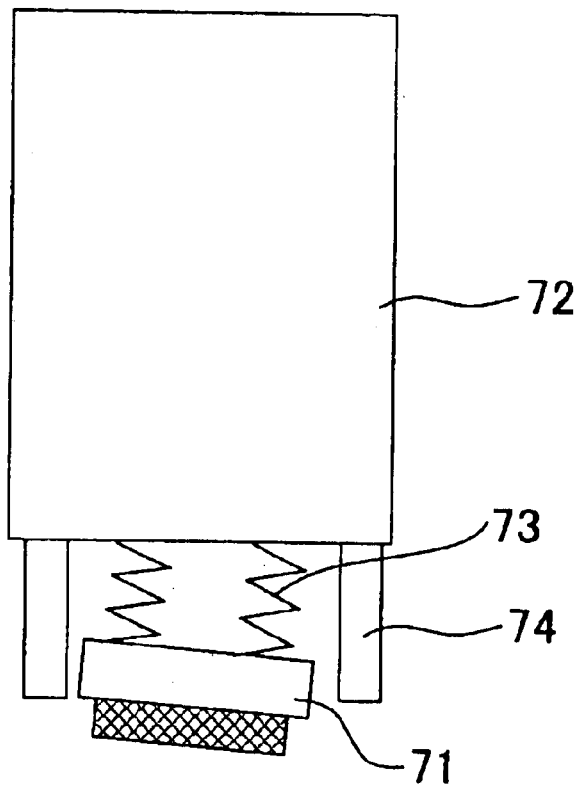
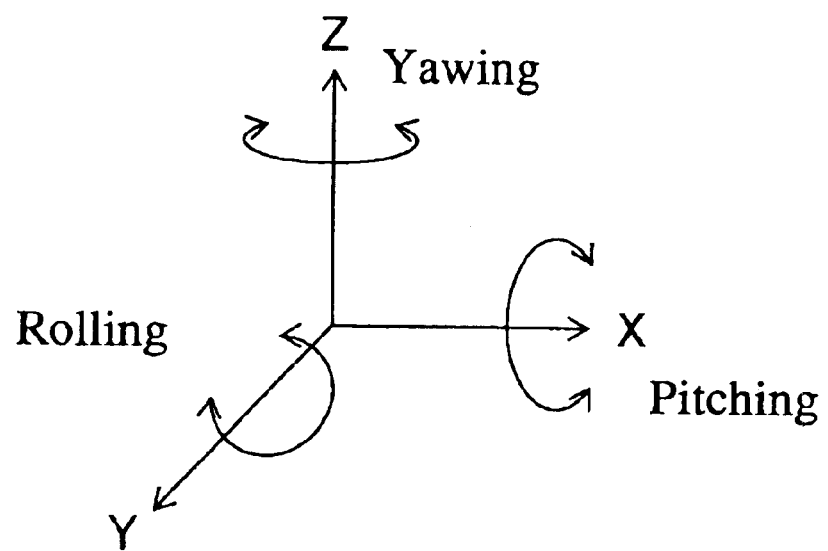

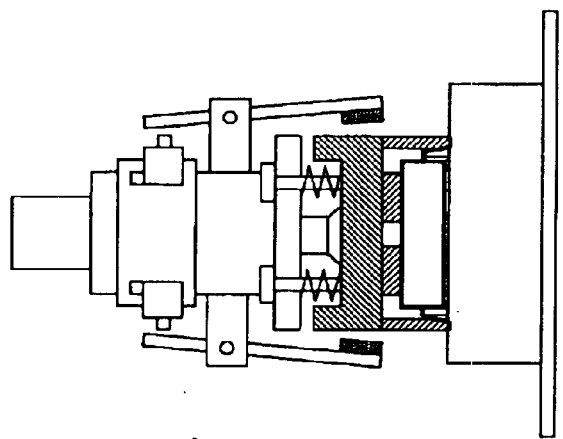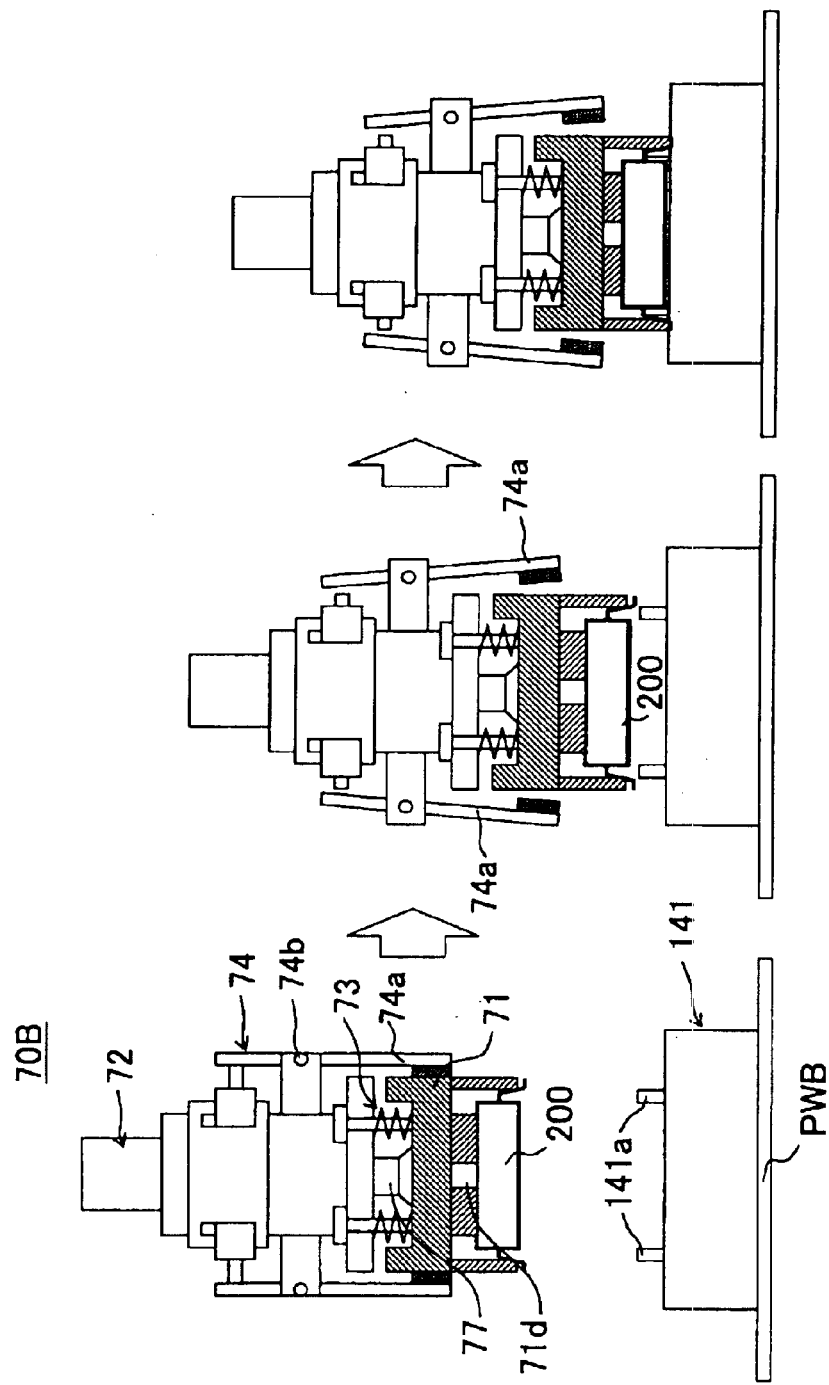

FIG.7
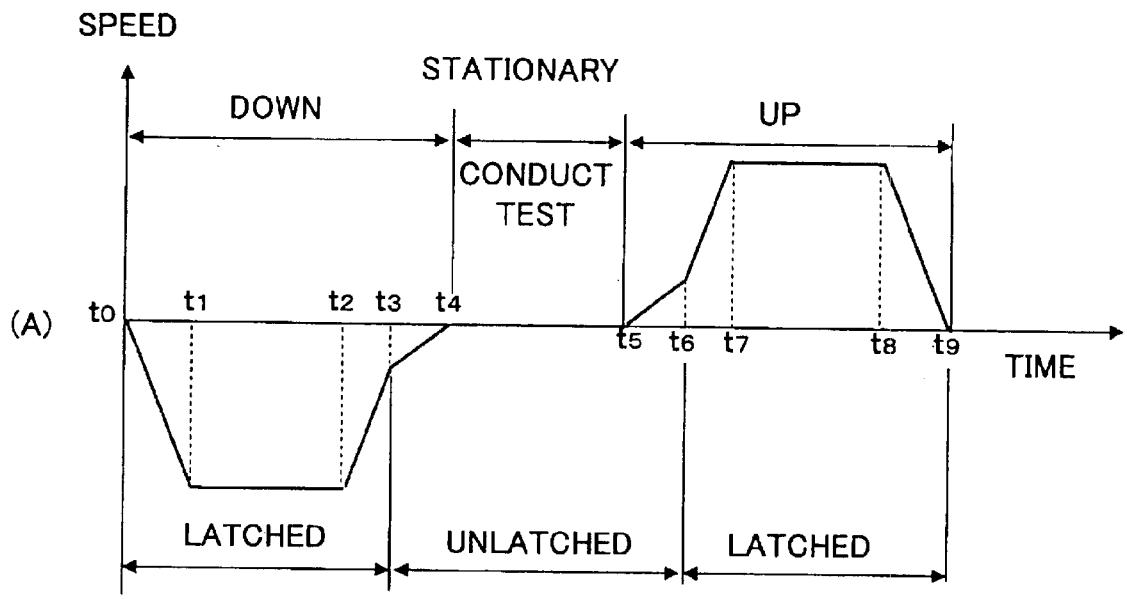
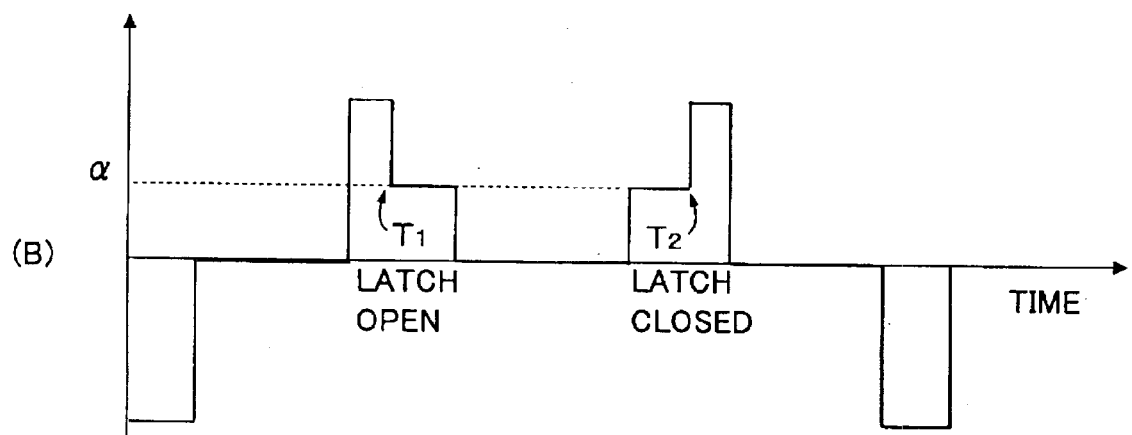

FIG.10
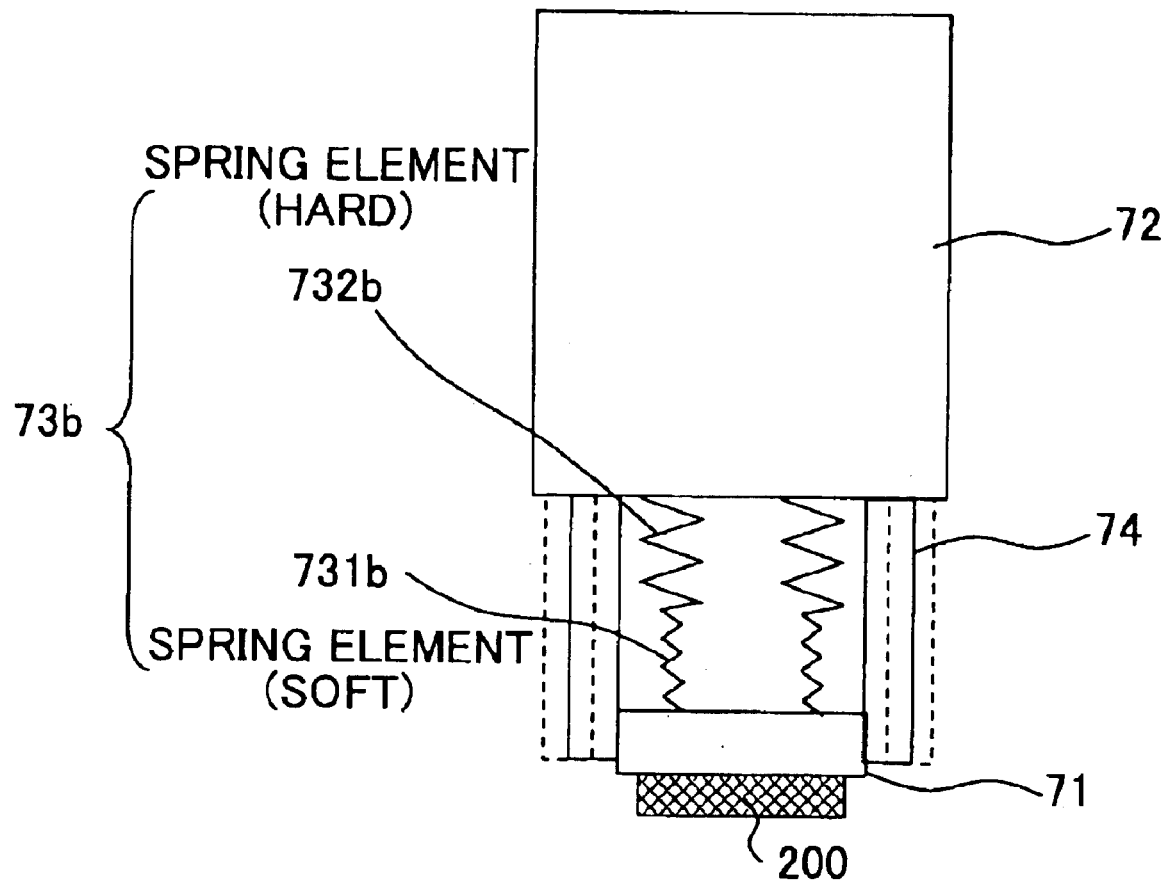

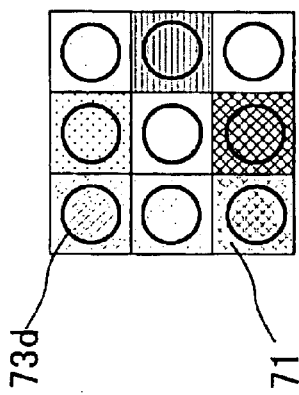
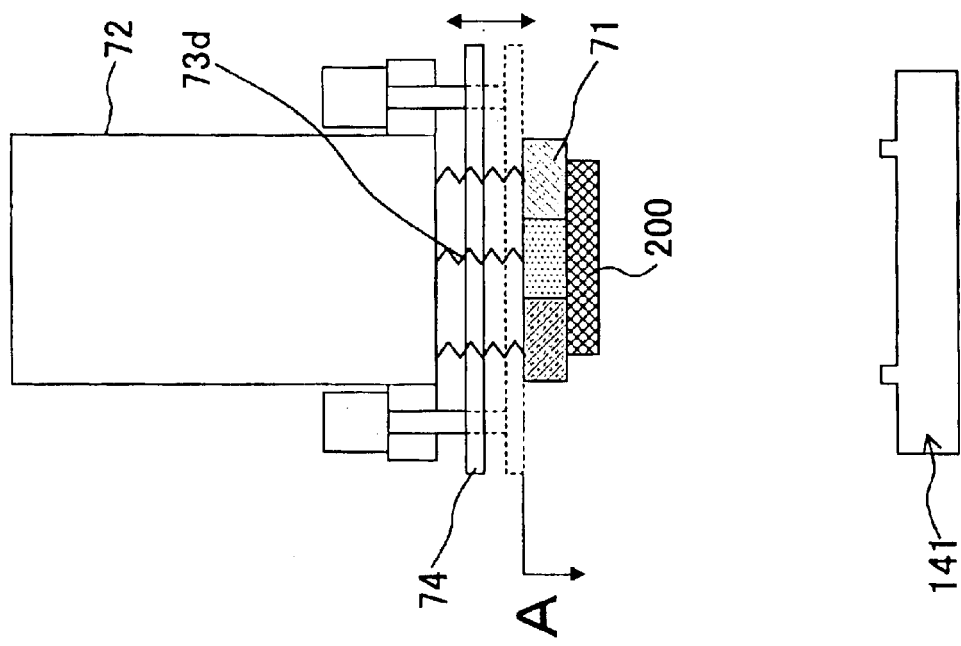

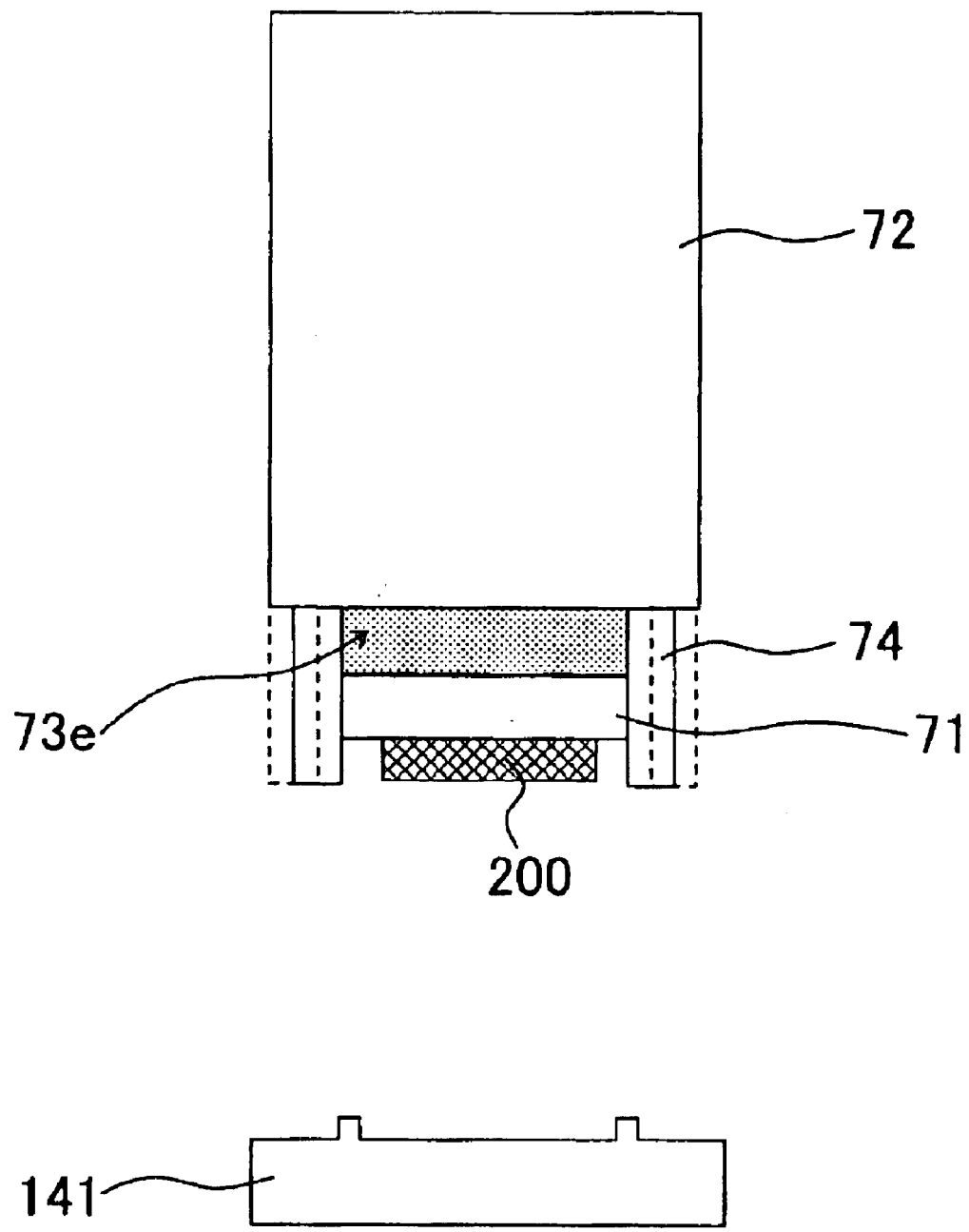

FIG.15
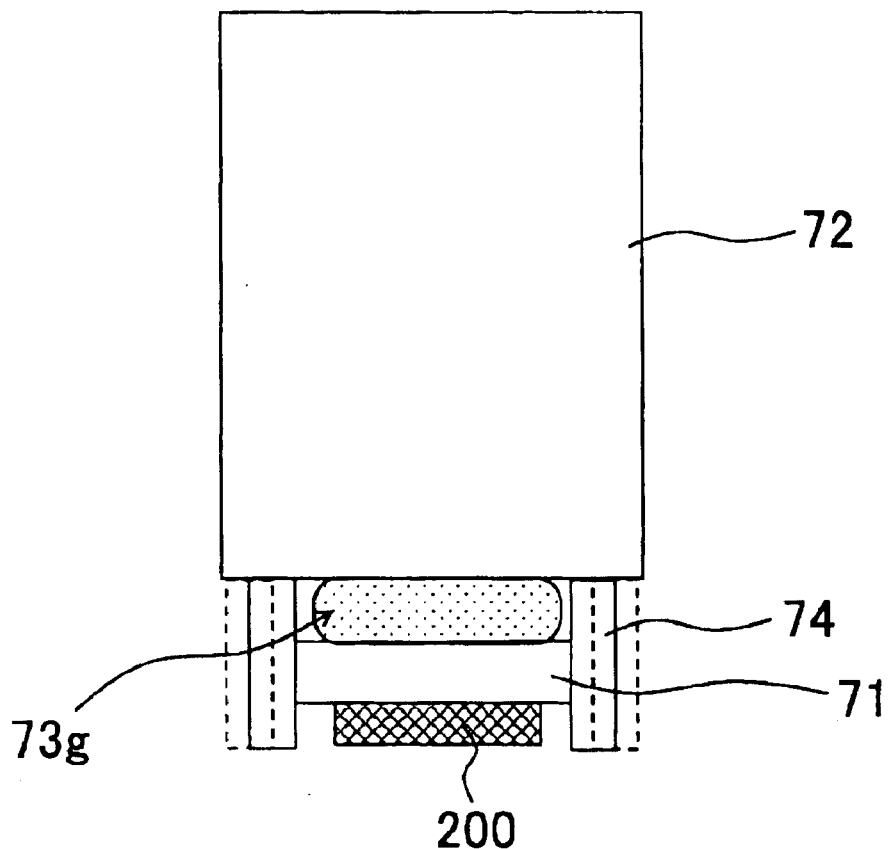
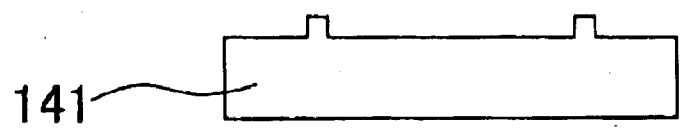

HANDLING APPARATUS AND TEST SET USING THE HANDLING APPARATUS

BACKGROUND OF THE INVENTION

1. Field of the Invention

The present invention relates to a handling apparatus for handling an object, such as an LSI, when positioning, carrying, placing, or connecting the object with respect to a target, and relates to a test set using such a handling apparatus.

2. Description of the Related Art

Handling apparatuses are used for various purposes, for example, inserting an electronic component (e.g., an LSI) into a socket.

When inserting an electronic component into a socket for electric tests using a handling apparatus, the electronic component has to be precisely positioned with respect to the socket and pressed against the contact electrode of the socket under a uniform pressure. However, the conventional handling apparatus often fails to position the electronic component precisely parallel to the socket, and therefore, fails to achieve a uniform contact pressure. The conventional apparatus overcomes this problem by giving elasticity to the contact electrode to absorb a displacement or offset from the parallel position making use of the deformation of the contact electrode, thereby guaranteeing uniform contact pressure between the electronic component and the socket.

By the way, there is a rapidly growing tendency extending back over recent years toward miniaturization of products and higher performance with increased operation speed has grown rapidly. To respond to this demand, the contact electrode of a socket used for electric tests is also miniaturized, employing a multi-polar structure. In addition, it is desired for the contact electrode to be further reduced in length (for example, up to 0.5 mm), while improving the electric characteristics of the contact electrode, as illustrated in Table 1 below.

TABLE 1

| Contact electrode | conventional | Future |
|---|---|---|
| Length l | 5 mm | 0.5 mm |
| Inductance L | 5 nH | ≦0.5 nH |
| Target Frequency f | 400 MHz | ≧5 GHz |
| Deformation δ | 0.5 mm(500 um) | ≦0.1 mm(100 um) |

However, as the contact electrode is miniaturized, the deformation of the contact electrode inevitably decreases (for example, to 0.1 mm). Accordingly, it is no longer possible for the deformation of the contact electrode alone to correct the size error or the displacement of the electronic component from the parallel position relative to the socket.

Japanese laid-open patent publication 2002-5990 discloses a handling apparatus having a mechanism that retains a vacuum holder for holding an electronic component. The vacuum holder is retained via multiple compression coil springs so as to be slightly movable. The vacuum holder that holds an electronic component moves down toward a socket to bring the electronic component into electric contact with the socket.

The handling apparatus disclosed in 2002-5990 is furnished with a mechanism for adjusting and correcting the displacement or positional offset of the electronic component from the parallel position relative to the socket. Accordingly, even if the deformation of the contact electrode is very small, the electronic component can be fit into the socket and brought into contact with the contact electrode precisely.

However, the handling apparatus with the vacuum holder retained via compression coil springs has another problem. That is, the electronic component held by the vacuum holder often falls off due to vibration of the vacuum holder, and the fragile electronic component is likely to be damaged by the fall. Especially, in the actual electric test, the transport mechanism carries the electronic component by moving the vacuum holder from one test station to another test station. Every time the transport mechanism stops or starts moving, large vibration may occur, which propagates to the electronic component. It is difficult for the handling apparatus disclosed in 2002-5990 to hold and carry the electronic component in a stable manner. If the transport mechanism is designed so as to move slowly and gently to prevent vibration, the electric test cannot be conducted efficiently.

SUMMARY OF THE INVENTION

Therefore, it is an object of the present invention to provide a handling apparatus that allows highly precise positioning and electrical contact between an electronic component and the contact electrode with improved stability of the electronic component during the handling.

It is another object of the present invention to provide a test set using such a handling apparatus.

To achieve the object, in one aspect of the invention, a handling apparatus comprises a main unit, a holder holding an object, a retainer that retains the holder so as to be displacable with respect to the main unit, a driving mechanism for driving the main unit to bring the object toward a target, and a latch unit that selectively brings the holder into a latched state, in which the displacement of the holder with respect to the main unit is restrained, or an unlatched state, in which the displacement of the holder with respect to the main unit is not restrained.

If the unlatched state is selected, the fixed state of the holder is released, and the object held by the holder can be displaced. Therefore, the object is well positioned with respect to the target in a flexible manner. If the latched state is selected, the holder is maintained securely with respect to the main unit, and therefore, the object can held in a stable manner.

The retainer retains the holder so that in the unlatched state the holder can be displaced along the X, Y and Z axes of the handling apparatus, and the holder can rotate about its moving axis. One of the X, Y, and Z axes is consistent with the moving axis of the main unit.

This arrangement allows the object to be accurately positioned with respect to the target in the unlatched state.

Alternatively, or in addition, the retainer retains the holder so that the holder can rotate about X, Y, and Z axes of the handling apparatus in the unlatched state. One of the X, Y, and Z axes is consistent with the moving axis of the main unit.

With this arrangement, when the object is pressed against the target, positional offset or inclination of the object from the parallel position relative to the target can be absorbed in the unlatched state.

The retainer utilizes at least one of a mechanical spring, a fluid, a porous elastic material, a gel, and magnetism, thereby allowing the object held by the holder to be slightly movable in the unlatched state.

The holder may be divided into multiple sections, and each section being retained by the retainer with respect to the main unit. In this case, each section is independently displacable in the unlatched state, which can absorb positional offset from the parallel position more efficiently. Consequently, the object can be positioned and aligned more precisely with respect to the target.

The latch unit includes a latching member that is movable between a latched position, at which the latching member is engaged with the holder, and an unlatched position, at which the latching member is disengaged from the holder. At the latched position, stability of handling the object can be guaranteed. At the unlatched position, the object can be positioned and aligned with respect to the target flexibly. The motion of the latching member between the latched position and the unlatched position may include not only linear motion, but also nonlinear motion including rotation, pivoting, and other motions.

Preferably, the handling apparatus further comprises a switching member configured to switch the latch unit between the latched state and the unlatched state based on at least one of a distance between the object and the target, an amount of motion of the main unit, a moving speed of the main unit, and an acceleration of the main unit.

For example, the switching member switches the latch unit from the latched state to the unlatched state before the object comes into contact with the target. With this arrangement, the object can be stably held by the holder immediately before it comes into contact with the target. Upon releasing the latched state, the object can be positioned so as to be precisely parallel to the target.

In the second aspect of the invention, a test set for testing an object is provided. The test set comprises a test unit configured to carry out a test of the object, and a handling structure for transporting the object and positioning the object with respect to the test unit. The handling structure comprises a main unit, a holder that holds the object, a retainer that retains the holder so as to be displacable with respect to the main unit, a driving mechanism for driving the main unit to move the object toward the tester, and a latch unit that selectively switches the handling structure between a latched state, in which the displacement of the holder with respect to the main unit is restrained, and an unlatched state, in which the displacement of the holder with respect to the main unit is not restrained.

The object to be tested is, for example, an electronic component. In this case, the test unit includes a socket having a contact electrode to carry out an electric test for the electronic component. The electric test includes not only testing the operation and characteristics of the electronic component, but also writing data in the electronic component.

BRIEF DESCRIPTION OF THE DRAWINGS

Other objects, features, and advantages of the present invention will become more apparent from the following detailed description when read in conjunction with the accompanying drawings, in which:

FIG. 2 illustrates a carriage 70B with a handling structure according to an embodiment of the invention;

FIG. 3A illustrates the latched state and the unlatched state of the handling structure in a front view, and FIG. 3B illustrates the latched state and the unlatched state in a bottom view of the carriage;

FIG. 4 illustrates the degree of freedom of the vacuum holder for holding the object to be tested;

FIG. 5A illustrates the carriage at a descending start position during handling the object, FIG. 5B illustrates the carriage at a mode switching position where the handling structure is switched from the latched state to the unlatched state, and FIG. 5C illustrates the carriage at the lowermost position where the object is fit into the socket of the tester;

FIG. 7 illustrates the second example of the mode switching, in which FIG. 7A is a chart showing the relation between the up/down speed of the carriage and the mode switch timing, and FIG. 7B is a chart showing the relation between the up/down acceleration of the carriage and the mode switch timing;

FIG. 8 illustrates the third example of the mode switching using a pulse signal, in which

FIG. 10 illustrates a modification of the floating retainer 73 used in the handling structure;

FIG. 12A illustrates the third modification of the floating retainer, and FIG. 12B is a top view of the holder divided into multiple sections;

FIG. 13 illustrates the fourth modification of the floating retainer;

FIG. 15 illustrates the sixth modification of the floating retainer;

DETAILED DESCRIPTION OF THE PREFERED EMBODIMENTS

The preferred embodiments of the present invention will now be described in detail with reference to the attached drawings.

First, a test set for conducting electric testing of electronic components, to which a handling structure is applied, will be explained prior to describing the handling structure itself.

Figure 1:
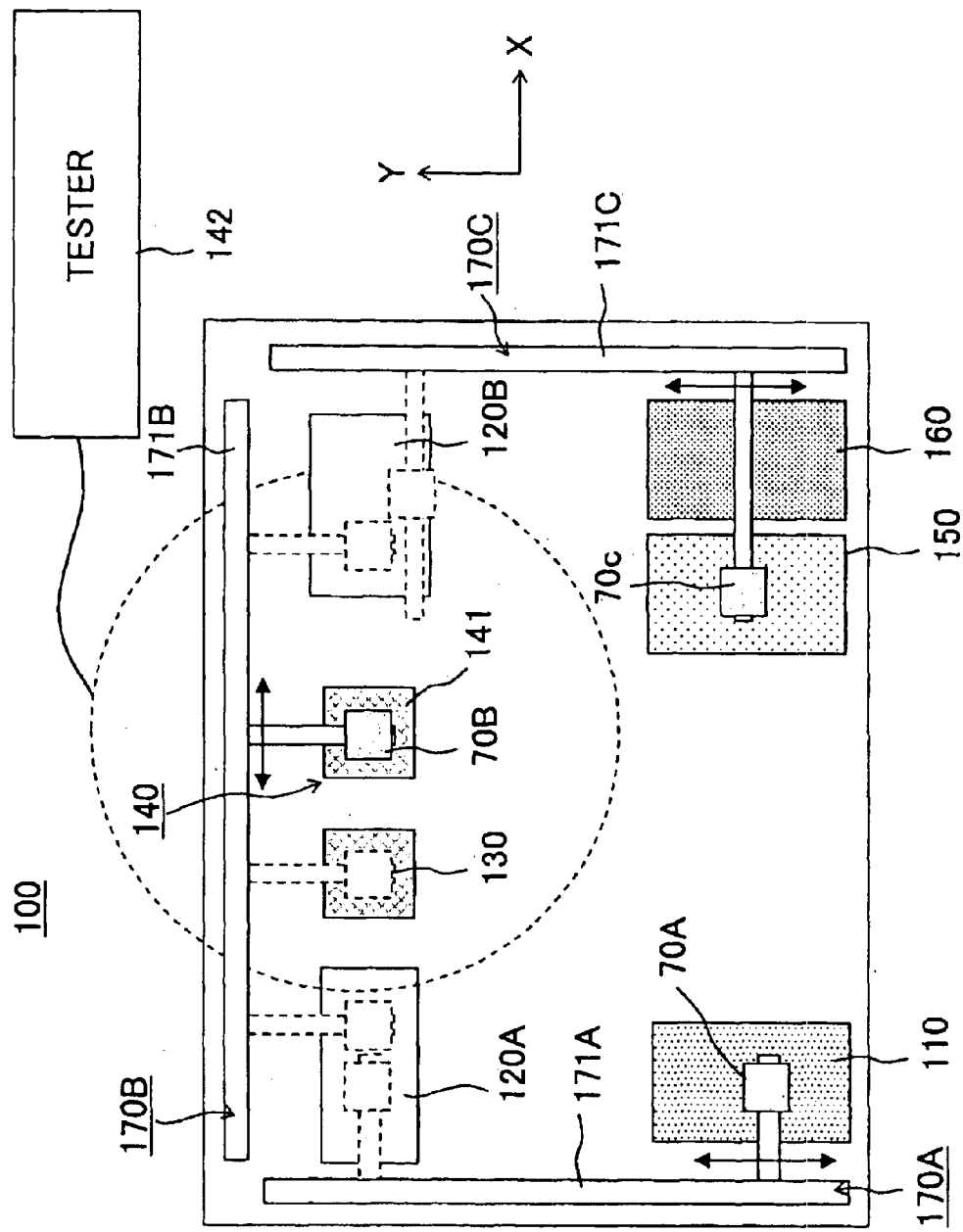
FIG. 1 is a top view of a test set 100 showing the entire structure thereof.

FIG. 1 is a top view of the test set 100 showing the entire structure of it. The test set 100 includes a stock tray 110 for receiving electronic components, such as LSI devices, that are to be tested, temporary trays 120A and 120B in which the electronic components under testing are temporarily placed, an alignment section 130, a test head 140, a standard product tray 150 for accommodating electronic components that have passed the test, and a defective product tray 160 for accommodating electronic components that are below the standard.

The test set 100 also includes transport mechanisms 170A, 170B, and 170C, which have carriages 70A, 70B, and 70C, rails 171A, 171B, and 171C, and driving mechanisms (not shown), respectively. The rails 171A, 171B and 171C extend in the X-Y plane, as indicated in the figure. The carriages 70A, 70B and 70C move along the associated rails 171A, 171B and 171C.

The test head 140 has a socket (or a contactor) 141 for receiving the electronic component to be tested. The socket 141 is electrically connected to the tester 142 via the test head 140. The test head 140, the socket 141, and the tester 142 comprise a test unit. The tester 142 operates so as to carry out a predetermined electric test of the electronic component fit into the socket 141.

In conducting the electric test of the electronic component, the following steps are taken. (1) An electronic component to be tested is placed on the stock tray 110. (2) The electronic component to be tested is transported from the stock tray 110 to the temporary tray 120A using the transport mechanism 170A. (3) This electronic component is then transported from the temporary tray 120A to the alignment section 130 using the transport mechanism 170B. (4) Positional correction is made to the electronic component at the alignment section 130. (5) The aligned electronic component is transported from the alignment section 130 to the test head 140 using the transport mechanism 170B. (6) The electronic component is fit into the socket 141 of the test head 140 to conduct the electric test. (7) The tested electronic component is then transported from the test head 140 to the temporary tray 120B using the transport mechanism 170B. (8) The electronic component that has been subjected to the electric test is sorted to the standard product tray 150 for receiving electronic components that have passed the test, or to the defective product tray 160 for receiving the electronic components that are below the standard.

FIG. 2 illustrates a carriage 70B having a handling structure according to an embodiment of the present invention. The handling structure is suitably used in the carriage 70B of the transport mechanism 170B to carry out the above described steps (3) through (7).

The carriage 70B has a main unit 72, a holder 71 for holding an object to be tested (that is, an electronic component in this example) by means of vacuum means 77 (see FIG. 19), and a floating retainer 73 for retaining the holder 71 in a resilient manner. The carriage 70B also has a latch unit 74 for selectively bringing the holder 71 into the latched state, in which the holder 71 is latched with respect to the main unit 72, or the unlatched state, in which the holder 71 is unlatched from the main unit 72. A Z-axis driving means 75 drives the main unit 72 up and down in the Z direction.

The Z-axis driving means 75 includes a motor 75a, a vertical driving mechanism 75b, and a controller 90 connected to the motor 75a. The rotational torque generated by the motor 75a is converted to a translational movement by the vertical driving mechanism 75b, which causes the main unit 72 to move in the Z direction. The controller 90 controls the Z-axis driving means 75 and the latch unit 74.

Figure 19:
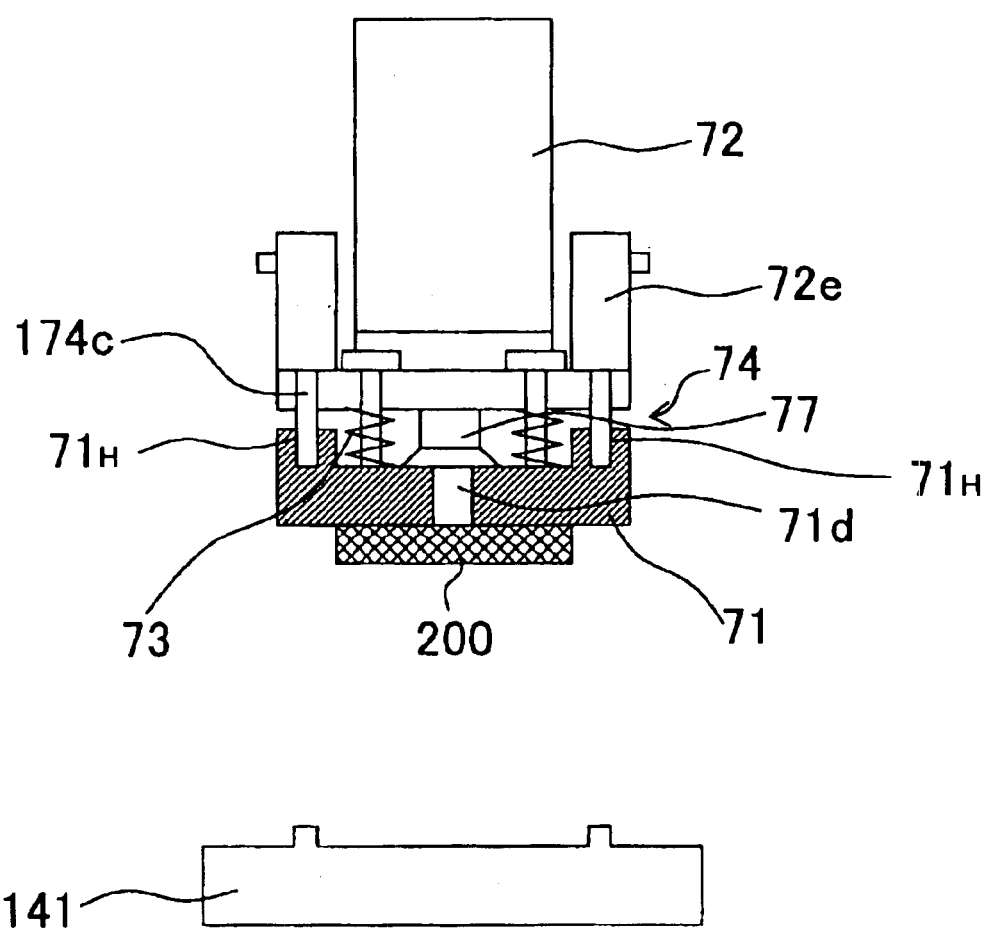
FIG. 19 illustrates the third modification of the latch unit.

The object 200 that is to be tested is held on the bottom face of the holder 71 via vacuum provided by vacuum means 77 (FIG. 19). Suction is applied to the object 200 at the opening 71d formed in the bottom face of the holder 71, through which the vacuum is supplied.

The bottom face of the holder 71 facing the socket 141 is shaped so as to be suitable to hold the object 200 by vacuum suction. Of course, the object can be held by the holder 71 by other means, such as an electrostatic chuck or Bernoulli chuck. The object 200 is released from the holder 71 when the vacuum holding by the vacuum means 77 is reduced.

Next, the floating retainer 73 and the latch unit 74 will be explained with reference to FIG. 3 and FIG. 4.

The floating retainer 73 illustrated in FIG. 3 is realized by compression coil springs 73a, and the holder 71 is retained with respect to the main unit 72 via the compression coil springs 73a. The latch unit 74 comprises a pair of latching members 74a. The latching members 74a are movable between the latched position indicated by the solid lines, at which displacement of the holder 71 is restrained, and the unlatched position indicated by the dashed lines, at which the holder 71 is disengaged from the latching members 74a. At the latched position, the latching members 74a are pressed against the holder 71 from both sides to fix the holder 71 with respect to the main unit 72.

At the latched position, the holder 71 moves together with the main unit 72 without relative displacement. In this specification, the state in which the displacement of the holder 71 with respect to the main unit 72 is restrained is referred to as a latched state.

In the latched state, the holder 71 is prevented from vibrating, and therefore, the object 200 held on the bottom face of the holder 71 via vacuum (FIG. 3B) can be maintained stably. In other words, when the latch unit 74 latches the holder 71, the holder 71 is substantially fixed to the main unit 72.

On the other hand, in the unlatched state of the latch unit 74 shown in FIG. 4, the holder 71 is released from the main unit by the latch unit 74, while it is retained by the compression coil springs 73. In this state, the holder 71 is movable in the all directions (e.g., in the X, Y, and Z directions in FIG. 4). In addition, the holder 71 becomes rotatable about all the axes (the X, Y, and Z axes), as indicated by the curved arrows. The state in which the displacement of the holder 71 with respect to the main unit 72 is not restrained is referred to as an unlatched state.

In the unlatched state, alignment and parallel-positioning of the object 200 with respect to the socket 141 (i.e., the target) can be achieved. To be more precise, translation of the holder 71 along the X, Y, and Z axes and rotation about the Z axis allow the position of the object 200 to be corrected with respect to the socket 141. Rotation of the holder 71 about the X and Y axes allows the offset of the object 200 from the parallel position relative to the socket 141 to be absorbed.

The unlatched state of the handling structure according to the invention is especially effective when the maximum possible deformation of the contact electrode 146 (see FIG. 2) of the socket 141 is small, and therefore, when the offset of the object 200 from the parallel position relative to the socket 141 cannot be absorbed by the deformation of the contact electrode 146 alone. As miniaturization of the contact electrode 146 of the socket 141 progresses, the length and deformation of the contact electrode 146 decrease, and it is expected that the maximum deformation of the contact electrode 146 will be below 0.1 mm in the near future. Accordingly, it is practical to furnish the carriage 70B with a function of absorbing offset from the parallel position, besides that provided by the elasticity of the contact electrode 146 of the socket 141. The offset-absorbing function is realized by making the holder 71 movable with respect to the contact electrode 146 under a certain condition.

FIGS. 5A through 5C illustrate how the latch unit 74 operates when the carriage 70B places the object 200 onto the socket 141. This operation corresponds to step (5) described in conjunction with FIG. 1, that is, transporting the electronic component from the alignment section 130 to the test head 140. The holder 71 of the carriage 70B is holding by means of vacuum suction the object 200 that has been correctly positioned at the alignment section 130 in the previous step (4).

The latch unit 74 in the example shown in FIG. 5 comprises a pair of latching members 74a. Each of the latching members 74a is pivotable about the associated pin 74b. Thus, the latch unit 74 is movable between the latched position (or the closed position) and unlatched position (or the open position). The socket 141 has guides 141a projecting toward the carriage 70B. The contact electrode 146 of the socket 141 is electrically connected to the tester 141 (see FIG. 1) via the printed wiring board (PWB) furnished to the bottom of the socket 141.

As illustrated in FIG. 5A, the carriage 70B is driven by the Z-axis driving means 75 (see FIG. 2), and it descends toward the socket 141 with the latching members 74a kept at the latched position. In this state, the holder 71 stably holds the object 200 without vibration. Then, as illustrated in FIG. 5B, the latching members 74a pivot to the unlatched position immediately before the object 200 comes into contact with the guides 141a of the socket 141. In other words, the latch unit 74 is switched from the latched state to the unlatched state.

Then, when the carriage 70B further descends, as illustrated in FIG. 5C, the object 200 is guided into the socket 141 by the guides 141a. Finally, the object 200 is pressed against the contact electrode 146 of the socket 141 by means of the resilience of the floating retainer 73. In this state, the prescribed electric test is conducted.

The descent of the carriage 70B may be stopped when a desired contact pressure is produced between the socket 141 and the object 200. The object 200 may be released from the holder 71 upon or around the time of occurrence of physical contact between the object 200 and the socket 141. The positioning of the object 200 with respect to the socket 141 may be promoted using guide pins or other mechanisms, in place of the guide projections 141a.

In this manner, the carriage 70B brings the object 200 into contact with the socket 141, while precisely positioning and aligning the object 200 with respect to the socket 200 using the holder 71, which is displacable in the unlatched state. Even if the holder 71 is slightly inclined, as illustrated in FIG. 4, due to assembling error, for example, inclination of the object 200 from the parallel position relative to the socket 200 can be absorbed by the holder 71 released from the latched state. Consequently, a uniform contact pressure is produced between the object 200 and the socket 141, and the reliability of the test result can be improved.

The carriage 70B moves from the alignment section 130 to the socket 141, and from the socket 141 (or the test head 140) to the temporary tray 120B in a horizontal plane, as illustrated in FIG. 1, and also moves in the vertical direction by means of the Z-axis driving means 75. If the holder 71 is freely movable during the entire transportation process, as in the conventional technique, the holder 71 swings or vibrates all the time. Such continuous vibration makes it difficult to achieve the positioning or parallel-alignment between the object 200 and the socket 141 with the conventional handling apparatus. In addition, the object 200 is likely to fall off the holder 71, and it may be damaged or broken with the conventional handling apparatus.

On the contrary, the carriage 70B of the embodiment is in the unlatched state only when required for positioning and parallel alignment. If the stability of the object 200 is more important, the holder 71 is kept in the latched state. The latched state and the unlatched state can be switched arbitrarily, depending on the actual situation. Accordingly, precise positioning between the object 200 and the socket 141 can be realized, while the carriage 80B stably holding the object 200 is guaranteed, preventing undesirable fall or vibration of the object 200.

Figure 6:
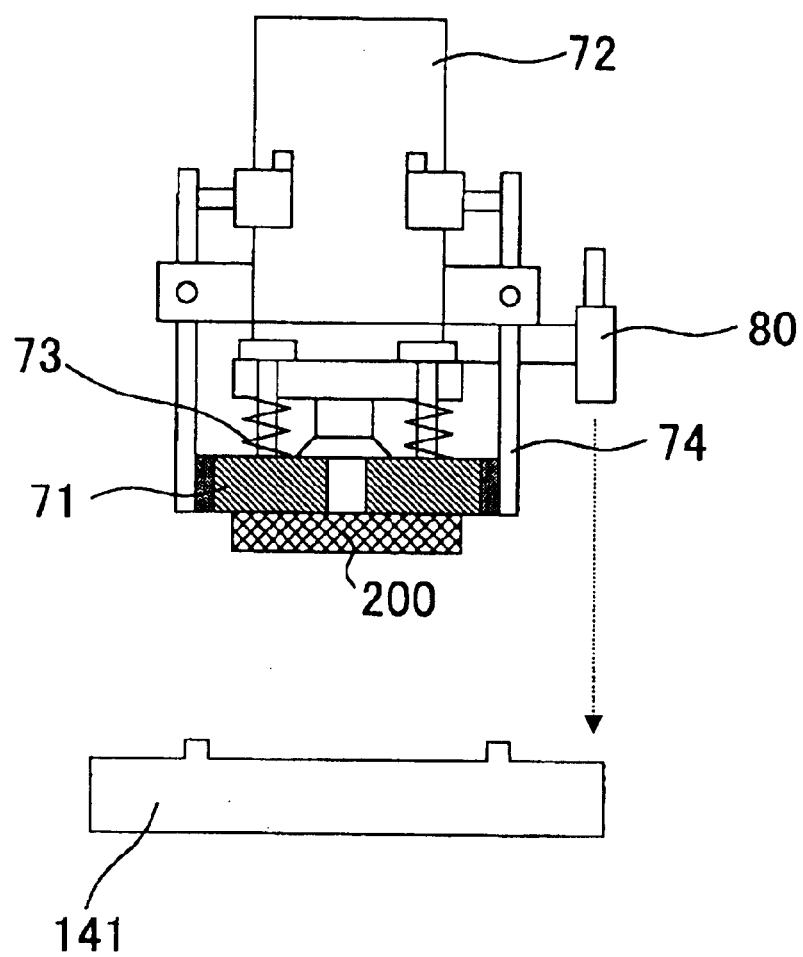
FIG. 6 illustrates an example of the mode switching using a range sensor.

FIG. 6 illustrates an example of switching the latch mode using a proximity sensor (or a reflecting sensor) 80. The proximity sensor 80 is fixed to the main body 72 of the carriage 70B. The proximity sensor 80 detects the relative distance to the target (i.e., the socket 141), and outputs a detection signal to the controller 90 (FIG. 2). The controller 90 generates a first driving signal for causing the unlatched state when the distance from the object 200 to the target (socket 141) becomes less than a first threshold value (for example, 5 mm), based on the detection signal. The controller 90 also generates a second driving signal for causing the latched state when the object 200 and the main unit 72 elevates after the test and when the distance between the tested object 200 and the target exceeds a second threshold value.

The first and second threshold values are determined based on the mounting height of the proximity sensor 80, the thickness of the object 200, and other factors. The second threshold value is such a value that the object 200 is sufficiently apart from the target (or the socket 141) so as not to contact with the target even if the holder 71 displaces upon release from the latched state. With this arrangement, the timing of mode switching can be easily adjusted by simply varying the threshold values. Accordingly, the handling structure can be applicable to various types of objects in the various fields.

FIG. 7 illustrates the second example of mode switching, which make use of change in the moving speed of the main unit 72 of the carriage 70B.

The main unit 72 moves down toward the target with the speed profile defined from t0 to t4 depicted in FIG. 7(A). Then, the main unit 72 stops descending and remains stationary (t4–t5) for the electric test. After the test, the main unit 72 moves up to the initial position from time t5 to t9. In order to prevent the object 200 and the socket 141 from breaking due to the force of an abrupt stop, the descending speed is reduced when the main unit 72 approaches the target (i.e., the socket 141) to a certain extent (t2–t3), and the speed is further reduced immediately before the main unit 72 is stopped (t3–t4). Similarly, when leaving the target, the main unit 72 starts elevating slowly (t5–t6). Then, when the main unit 72 is sufficiently apart from the target, the moving speed is increased (t6–t7).

In the example shown in FIG. 7(A), the holder 71 is unlatched during the period from t3 to t6. The controller 90 causes the latching members 74a to pivot to the open position to bring the holder 71 in the unlatched state when the acceleration of the main unit 72 settles to a predetermined value $\alpha$ at time T1, as illustrated in FIG. 7(B). Then, the acceleration of the main unit 71 again settles to $\alpha$ after the test at time T2, and the controller 90 causes the latching members 74a to pivot to the closed position to shift to the latched state. At $Tn_{odd}$ where the subscript n of Tn is an odd number, the unlatched state is realized. At $Tn_{even}$ where the subscript n of Tn is an even number, the mode is switched to the latched state. This arrangement allows the handling structure of the carriage 70B to switch between the latched state and the unlatched state for successively transported objects 200 when conducting the test successively.

The change in speed can be detected using an acceleration sensor, which may be fixed to the main unit 72 to detect the acceleration of the main unit 72. Alternatively, a sensor for sensing a relative displacement (or a stroke change) between the main unit 72 and the socket 141 may be used. As still another alternative, the controller 90 may detect a change in speed based on the instruction value output from the controller 90 to the motor 75a.

In the example shown in FIG. 7, the speed of the vertical motion of the main unit 72 is changed in response to the distance between the main unit 72 and the target. The mode switching is carried out based on the change in moving speed of the main unit 72. Accordingly, the above-described step (5) for conducting the electric test can be minimized, while preventing damage to the object to be tested.

Figure 8B:
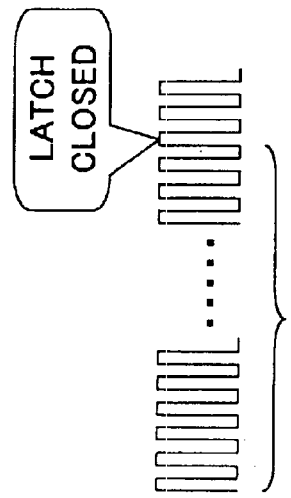
FIG. 8B is a chart showing the mode switch timing based on the pulse counting.
Figure 8A:
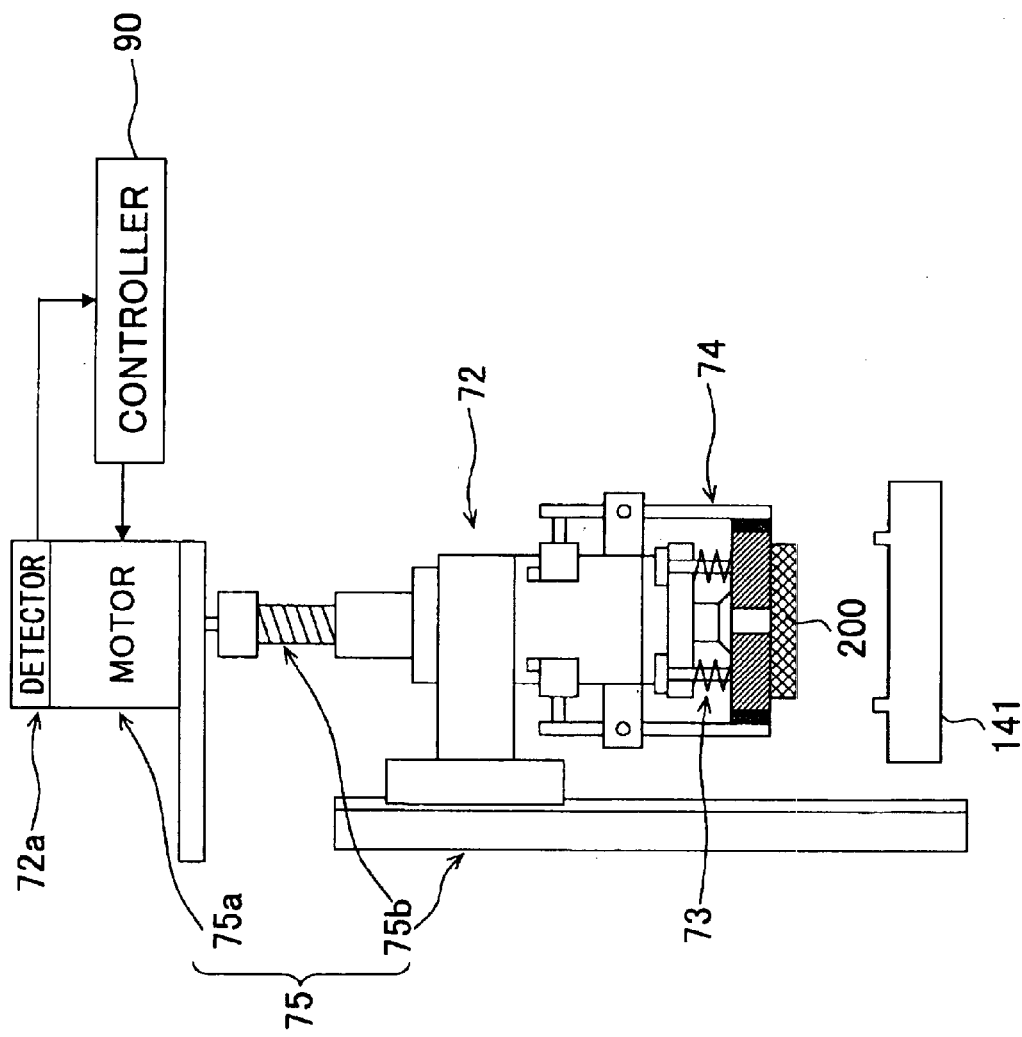
FIG. 8A is a side view of the carriage connected to a controller for supplying the pulse signal.

FIG. 8 illustrates the third example of mode switching using a pulse signal input to a pulse-driven motor 75a. The detector 72a, fixed to the main body 72 and electrically connected to the controller 90, counts the number of driving pulses input to the motor 75a. When the count reaches a predetermined number, the latch mode is switched, as illustrated in FIG. 8B. Of course, the number of driving pulses may be counted by the controller 90.

Figure 9:
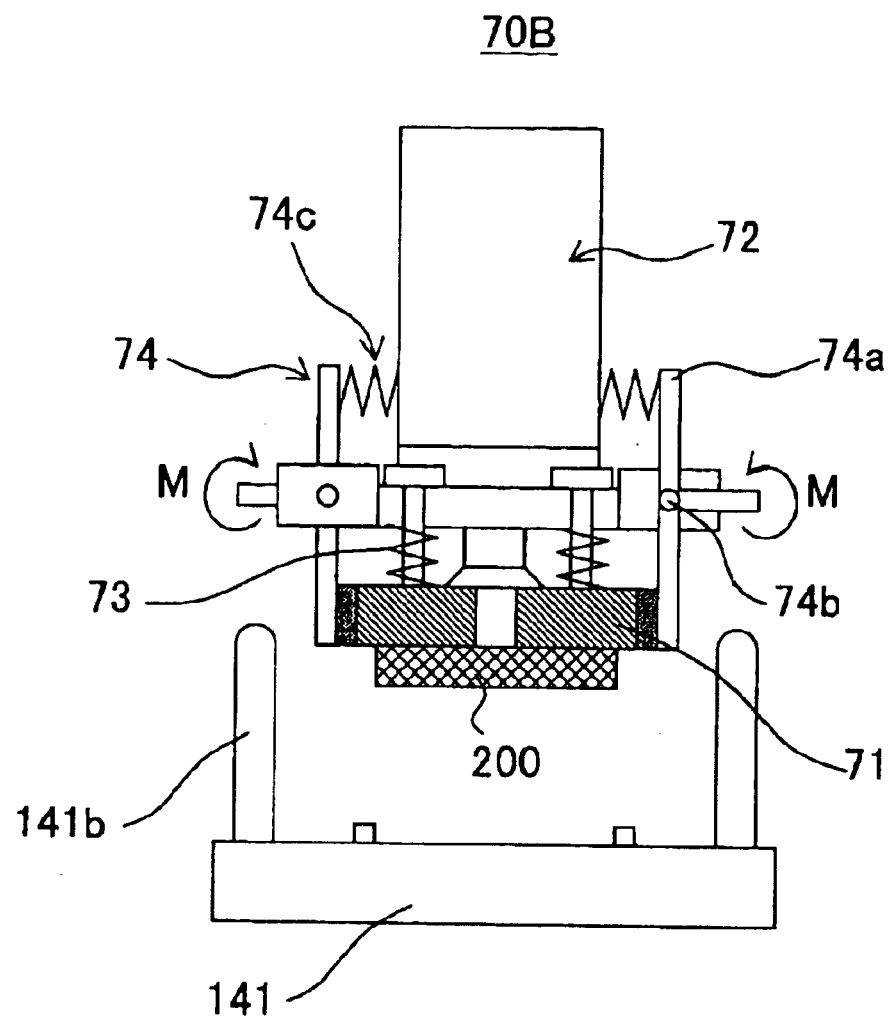
FIG. 9 illustrates the fourth example of the mode switching making use of the mechanical movement of the carriage.

FIG. 9 illustrates the fourth example, in which mode switching is conducted mechanically making use of the vertical motion of the main unit 72. In FIG. 9, the latch unit 74 comprises a pair of latching members 74a, each of which is coupled to the main body 72 using a pin 74b so as to be pivotable about the associated pin 74b. One end of each of the latching members 74a is forced outward by a coil spring 74c, which causes the other end of the latching member 74a to move inward, thereby latching the holder 71.

When the main body 72 descends to a certain height, the latching members 74a abut against the push rods 141b projecting from the target socket 141. This abutment produces a rotation moment (or a torque) M, and the latching member 74a rotates about the pin 74b opposing the resilience of the coil spring 74c. Consequently, the mode is switched to the unlatched state. On the other hand, when the main unit 72 is elevated to a certain height after the test, the latching member 74a rotates about the pin 74b in the direction opposite to the rotation caused by moment M. Accordingly, the handling structure of the carriage 70B returns to the latched state.

The example shown in FIG. 9 achieves simple mechanical mode switching, without using a motor 75a or a controller 90.

The latching mechanism shown in FIG. 9 may keep the handling structure of the carriage 70B in the latched state not only during the vertical motion, but also during the horizontal motion from the temporary tray 120A to the alignment section 130 (see FIG. 1). In this case, undesirable vibration of the electronic component can be prevented without fail at the beginning and the end of transportation and during the transportation in a horizontal plane. The carriage 70B can be shifted from one step to another step rapidly and efficiently.

FIG. 10 through FIG. 21 illustrate various modifications of the floating retainer 73 and the latch unit 74 used in the handling structure of the carriage 70B.

FIG. 10 illustrates the first modification of the floating retainer 73, which comprises compression coil springs 73b having a nonlinear spring characteristic. The nonlinear spring characteristic is realized by serially connecting a spring 731a with a relatively small spring constant, and a spring 732b with a relatively large spring constant. The soft spring 731b with the smaller spring constant is located on the side of the holder 71. Using the serially connected floating retainer 73, the initial contact between the object 200 and the socket 141 is flexible owing to the soft spring 731b with the smaller spring constant. Then, the object 200 is fit into the socket 141 reliably under the spring force of the hard spring 732b with the larger spring constant.

Figure 11:
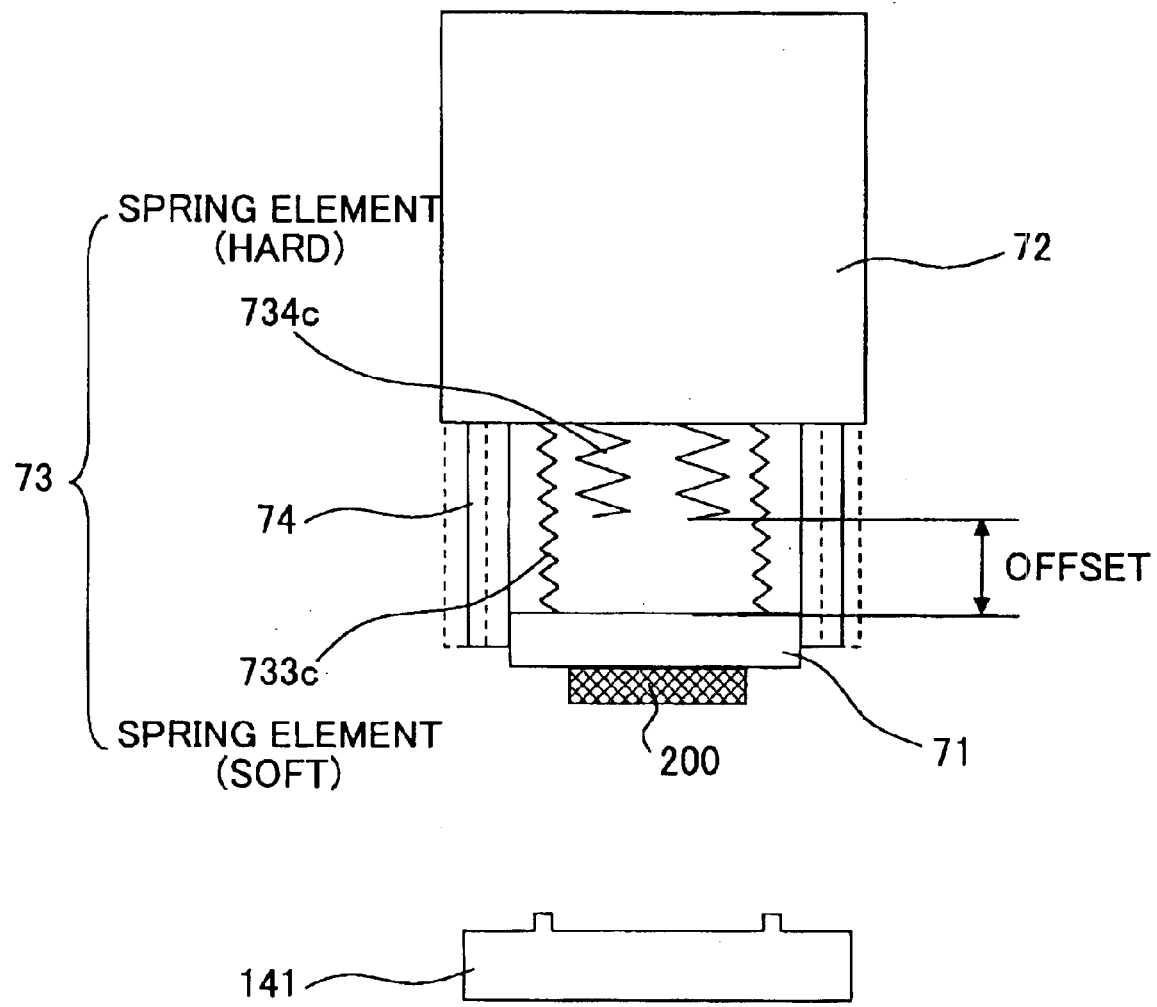
FIG. 11 illustrates the second modification of the floating retainer.

FIG. 11 illustrates the second modification of the floating retainer 73. The floating retainer 73 shown in FIG. 11 comprises two types of springs 733c and 734c with different lengths. The longer spring 733c, which is connected between the main unit 72 and the holder 71, has a smaller spring constant. The shorter spring 74c, which is connected only to the main unit 72 at one end, has a larger spring constant. The floating retainer 73 as a whole has the same nonlinear spring characteristic as that shown in FIG. 10.

In this example, initial flexible contact between the object 200 and the socket 141 is achieved by the longer spring 733c with the smaller spring constant. Final reliable contact between the object 200 and the socket 141 is achieved without fail by also engaging the shorter spring 734c with the larger spring constant. Since this arrangement prevents the soft spring 733c with the smaller spring constant from deforming completely, the durability of the floating retainer 73 improves.

FIGS. 12A and 12B illustrate the third modification of the floating retainer 73 using multiple compression coil springs 73d. Each of the compression coil springs 73d independently supports one of the divided sections of the holder 71, as illustrated in FIG. 12B. The holder 71 is divided into multiple sections in advance, and the compression coil springs 73d are provided so as to correspond to the respective sections of the holder 71. The sections of the holder 71 can be displaced independently from each other, with respect to the main unit 72 in the unlatched state.

This arrangement can absorb offset or inclination of the object 200 from the parallel position relative to the socket 141, as well as dimension errors of the object 200, more efficiently. Consequently, more precise parallel alignment between the object 200 and the socket 141 can be achieved. The compression coil spring 73d used in this modification may have a nonlinear spring characteristic, as in the first and second modifications shown in FIG. 10 and FIG. 11, respectively.

FIG. 13 illustrates the fourth modification of the floating retainer 73 using an elastic material 73e filled between the main unit 72 and the holder 71. The elastic material 73e includes, but not limited to, rubber, porous media, and expanded (or foamed) materials.

Figure 14:
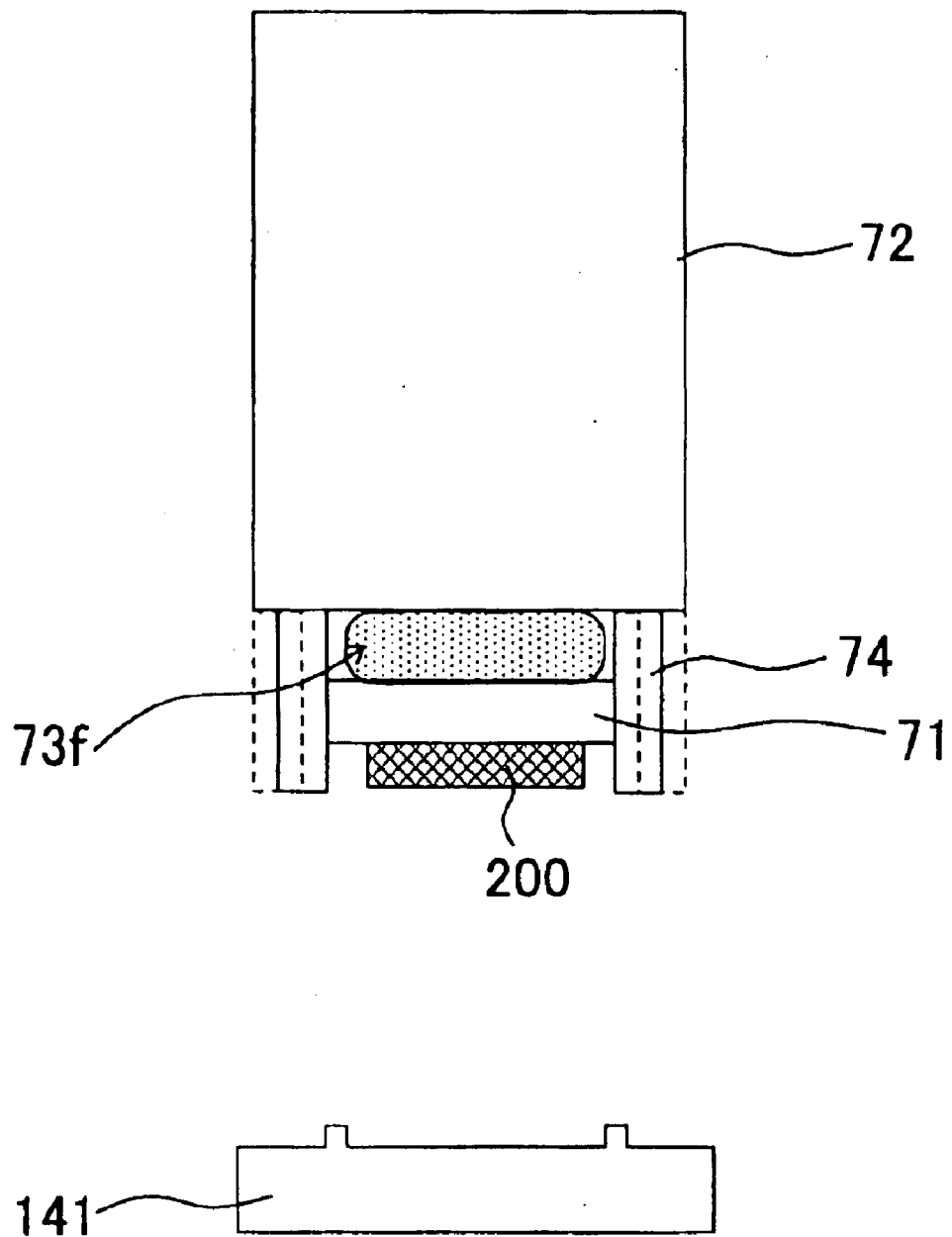
FIG. 14 illustrates the fifth modification of the floating retainer.

FIG. 14 illustrates the fifth modification of the floating retainer 73, using a pouch 73f filled with fluid. The pouch 73f is inserted between the main unit 72 and the holder 71. The term "fluid" includes not only liquid, but also gas, such as air. With this arrangement, the pressure of the fluid filled in the pouch 73f is uniform when the object 200 is in contact with the socket 141. Accordingly, the object 200 can be pressed against the socket 141 under a uniform contact pressure during the test.

FIG. 15 illustrates the sixth modification of the floating retainer 73, using a pouch 73g filled with a gel. The gel contained in the pouch 73g is watery hydro-gel consisting of, for example, silicone polymer and water. The pressure of the gel in the pouch 73g is uniform when the object 200 is pressed against the socket 141, as in the modification shown in FIG. 14. Consequently, the object 200 is in contact with the socket 141 under a uniform pressure, and the test reliability increases.

Figure 16B:
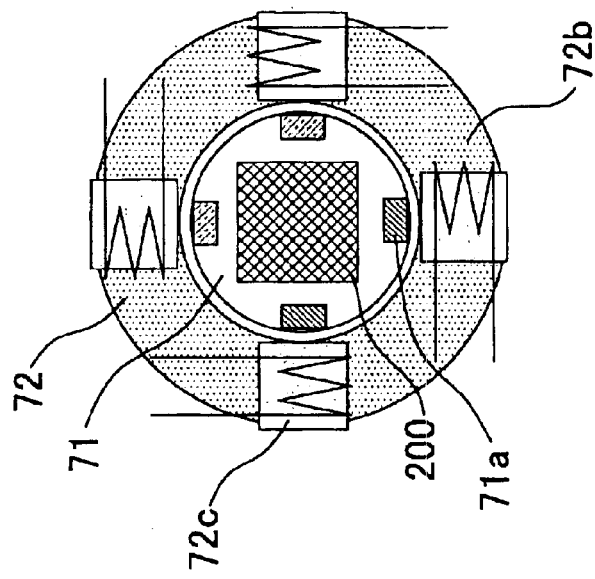
FIG. 16B is a bottom view of the holder that holds the object.
Figure 16A:
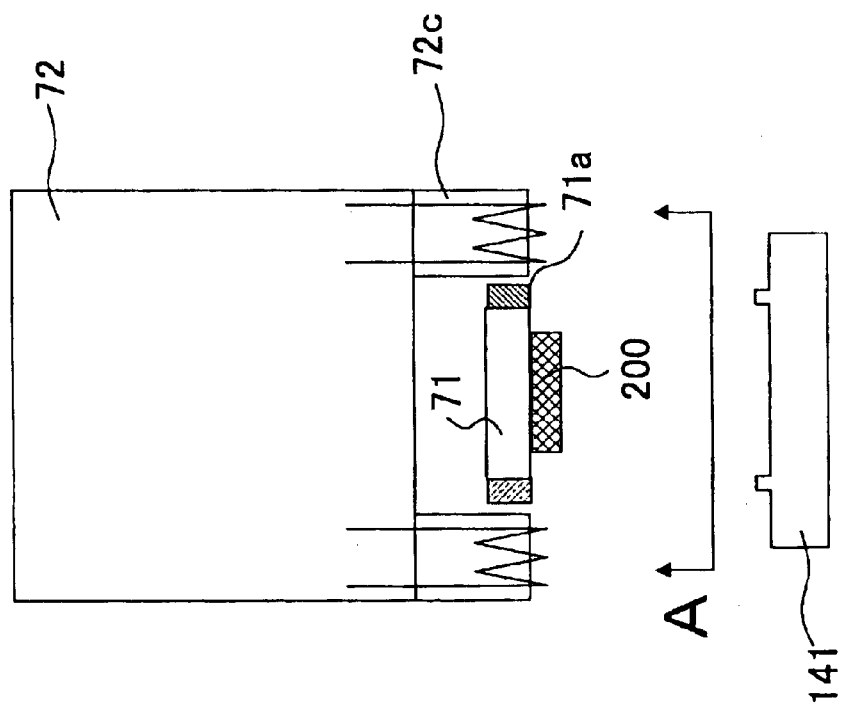
FIG. 16A illustrates the seventh modification of the floating retainer.

FIG. 16 illustrates the seventh modification of the floating retainer 73, where FIG. 16A is a front view of the handling structure, and FIG. 16B is a bottom view showing the arrangement of the floating retainer. In this example, the floating retainer comprises permanent magnets 71a arranged around the holder 71 at a constant interval, and electromagnets 72c provided to the main body 72 so as to correspond to the respective permanent magnets 71a. Appropriate attraction or repulsion is caused between the electromagnet 72c and the permanent magnet 71a to retain the holder 71 in the floating state, as illustrated in FIG. 16A. In addition, by controlling the attraction and repulsion between the electromagnet 72c and the permanent magnet 71a, the holder 71 is brought into either the latched state, in which the holder 71 is securely held by the electromagnets 72c, or the unlatched state, in which the holder 71 is released into the socket 141. To this end, the electromagnets 72c and the permanent magnets 71a also function as a latch unit 74.

Figure 17:
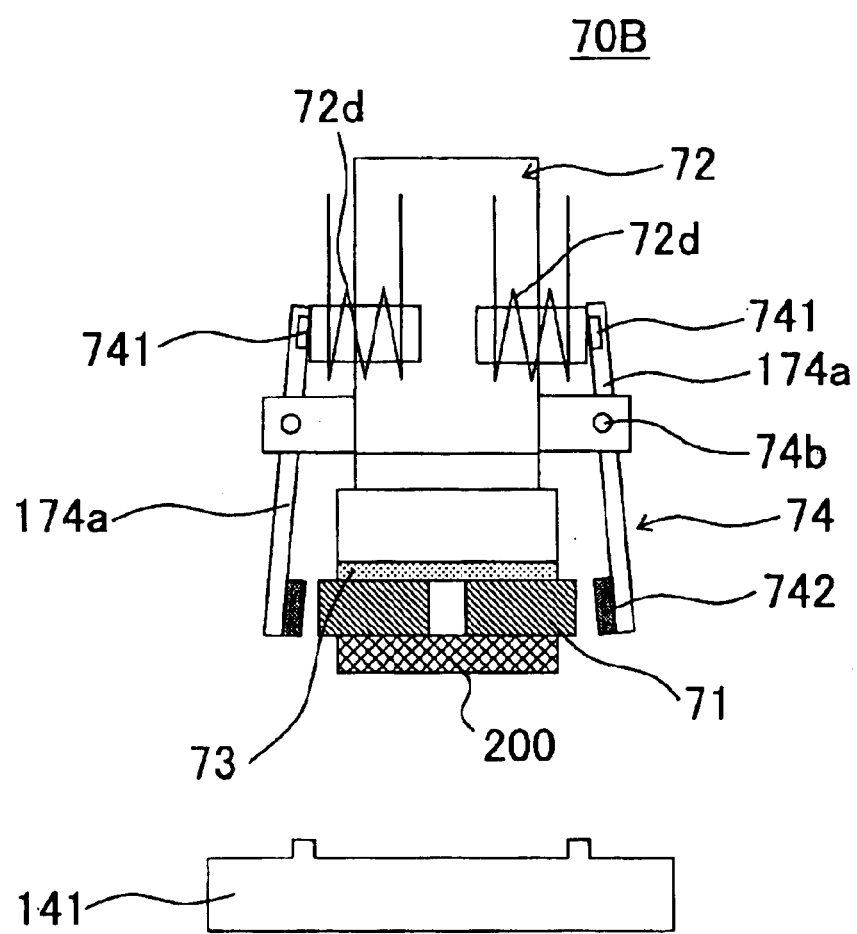
FIG. 17 illustrates a modification of the latch unit 74 used in the handling structure.

FIG. 17 illustrates a modification of the latch unit 74 using magnetic force. The latch unit 74 comprises a pair of latching members 174a coupled to the main unit 72 via the associated pins 74b. Each of the latching members 174a has a permanent magnet 741 on one end and a contact pad 742 on the other end. The contact pad 742 is made of a material with a large coefficient of friction, and the latching members 174a clamp the holder 71 at the contact pads 742 from both sides in the latched state. In place of or in addition to the contact pads 742 provided to the latching members 174a, another pair of contact pads with a large frictional coefficient may be provided to the holder 71.

Switching between the latched state and the unlatched state is regulated by attraction and repulsion between the permanent magnet 741 attached to the latching member 174a and the electromagnet 72d provided to the main unit 72. Due to the attraction or the repulsion, a rotational moment is generated about the pins 74b, which causes the latching members 174a to move between the latched position (or the closed position) and the unlatched position (or the open position). The magnetic force between the electromagnet 72d and the permanent magnet 741 may be controlled based on the moving speed or the acceleration of the main unit 72, which is described above with reference to FIG. 7.

Figure 18:
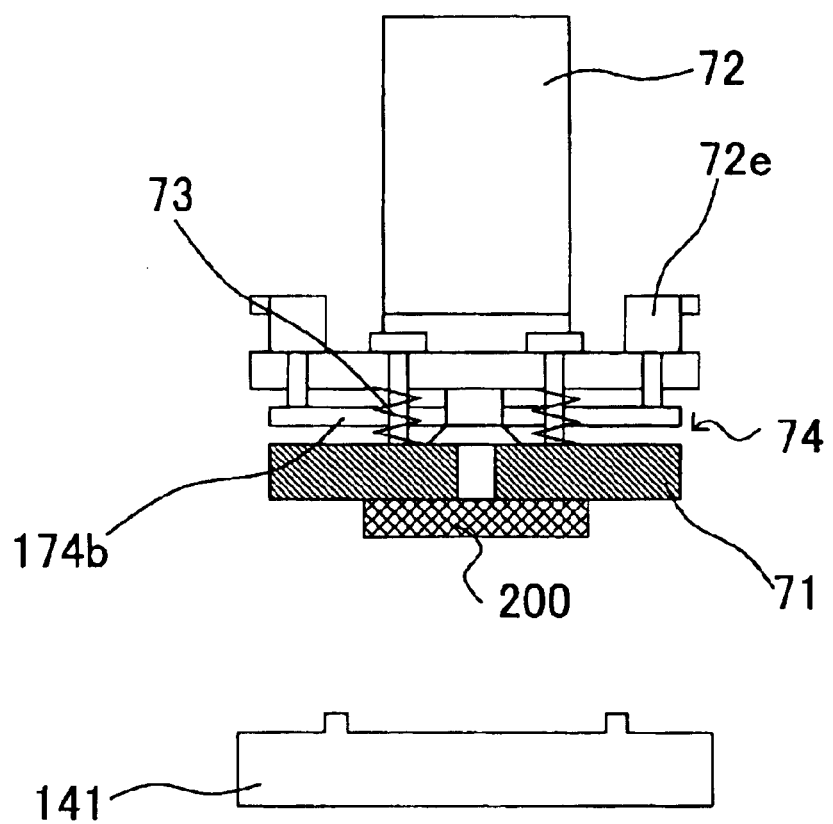
FIG. 18 illustrates the second modification of the latch unit.

FIG. 18 illustrates the second modification of the latch unit 74, which makes use of a frictional force. The latch unit 74 comprises a friction clutch 174b, which is located over the holder 71. The friction clutch 174b is a disc or a plate having a flat and parallel surface. In the latched state, the bottom face of the friction clutch 174b comes into contact with the top face of the holder 71. Accordingly, the bottom face of the friction clutch is made of a material having a large coefficient of friction. Because of the frictional force between the friction clutch 174b and the holder 71, the holder 71 can be latched stably with respect to the main body 72. In place of or in addition to the bottom face of the friction clutch 174b, the top face of the holder 71 may be formed of a material having a large coefficient of friction.

When precise positioning or parallel alignment is required immediately before placing the object 200 onto the socket 141, the friction clutch 174a separates from the holder 71, and the holder 71 is released to the unlatched state, as illustrated in FIG. 18.

Switching between the latched state and the unlatched state is carried out by a vertical motion of the friction clutch 174 caused by the cylinder 72e furnished to the main unit 72. The switching timing may be controlled based on the moving speed or the acceleration of the main unit 72, as described above in conjunction with FIG. 7.

FIG. 19 illustrates the third modification of the latch unit 74 using pins 174c. Holes 71H are formed in the top face of the holder 71 in order to receive the pins 174c of the latch unit 74. The pins 174c move up and down by means of cylinders 72e provided to the main unit 72 when switching between the latched state and the unlatched state. During the transportation of the object 200, the pins 174c of the latch unit 74 are fit into the holes 71H of the holder 71 to secure the vacuum holding of the object 200, as illustrated in FIG. 19. When positioning and placing the object 200 onto the socket 141, the pins 174c move upward to release the holder 71. Then, flexible positioning of the object 200 is carried out in the unlatched state by means of the floating retainer 73.

Figure 20:
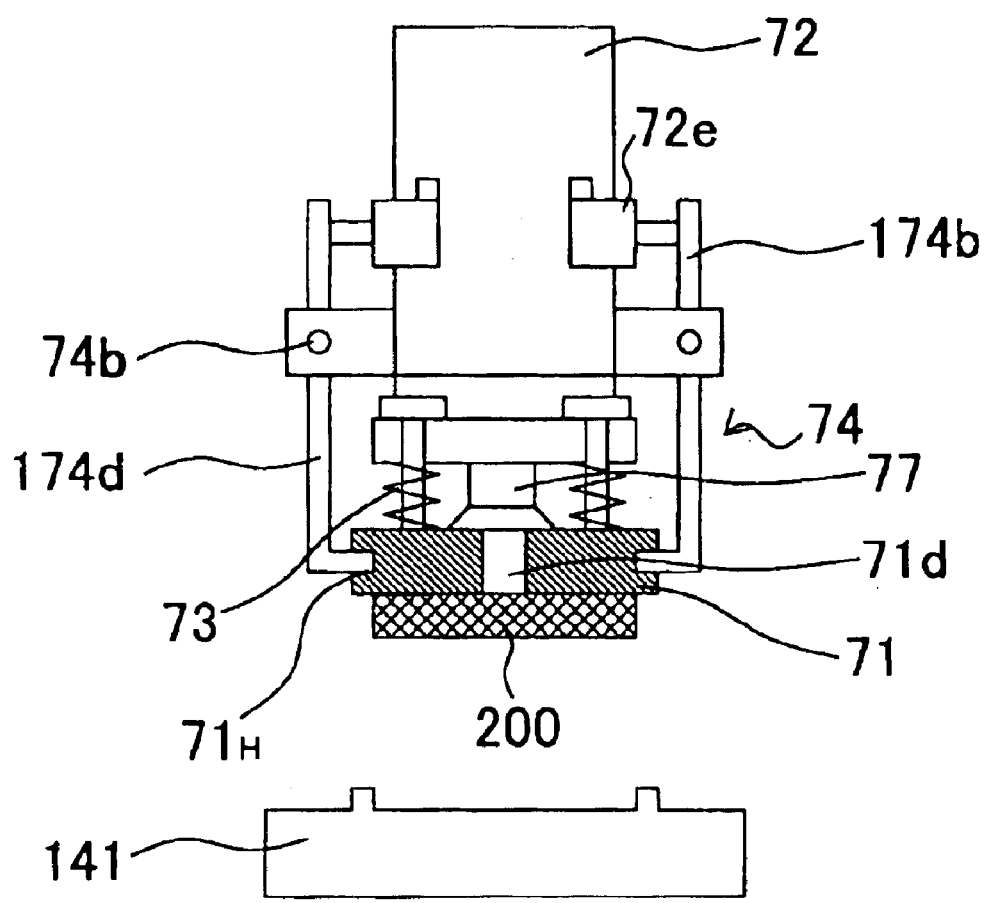
FIG. 20 illustrates the fourth modification of the latch unit.

FIG. 20 illustrates the fourth modification of the latch unit 74 using a pair of pivoting latching members 174d and corresponding holes 71H formed in the holder 71. Each of the latching members 174d is coupled to the main unit 72 so as to be pivotable about pin 74b. Switching between the latched state and the unlatched state is carried out by pivoting the latching member 174d using the cylinder 72e. In the latched state, one end of the L-shaped latching member 174d is fit into the hole 71H formed in the side of the holder 71, as illustrated in FIG. 20. To switch to the unlatched state, the latching member 174d pivots about the pin 74b and opens outward to release the holder 71. The pivoting timing may be controlled based on the moving speed or the acceleration of the main unit 72, as described above in conjunction with FIG. 7.

Figure 21:
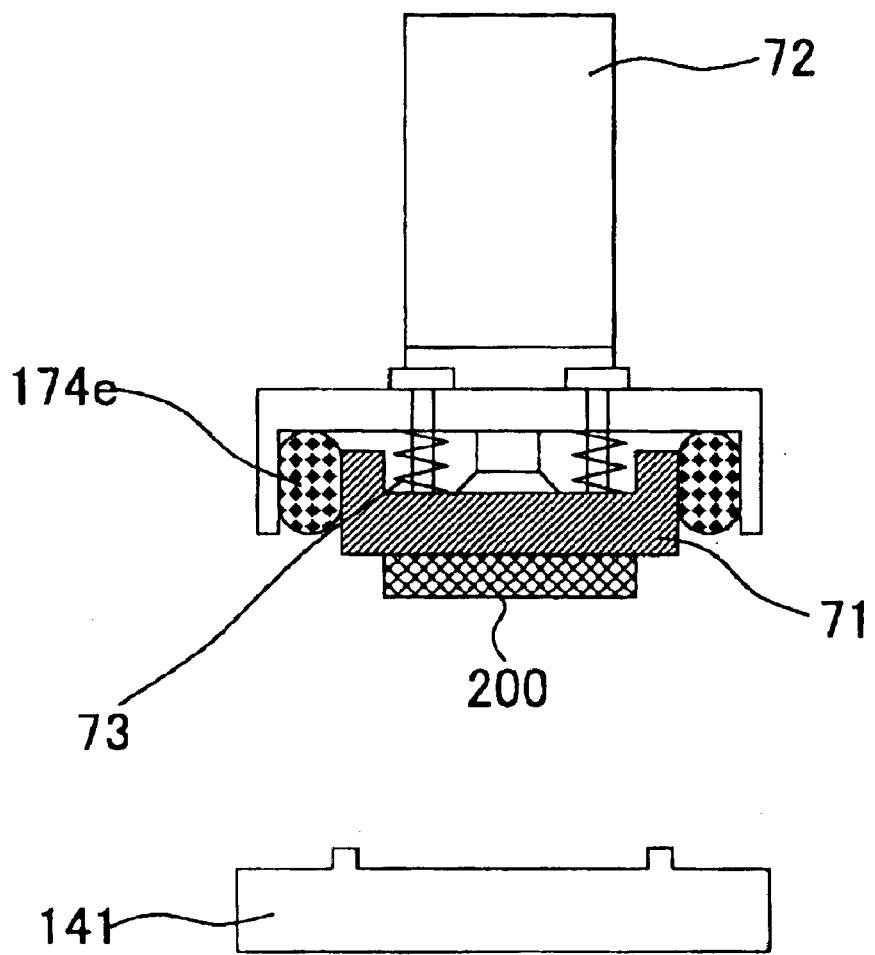
FIG. 21 illustrates the fifth modification of the latch unit.

FIG. 21 illustrates the sixth modification of the latch unit 74 using a cushion 174e. The cushion 174e is, for example, an annular cushion inserted between the side of the holder 71 and the main unit 72. The cushion 174e is made of a stretchable material with a large coefficient of friction. In the latched state, fluid, such as the air or liquid, is supplied from a supply unit (not shown) into the cushion. The cushion expands and presses itself against the holder 71. In the unlatched state, the fluid filled in the cushion 174e is removed by vacuum suction to release the holder 71.

Figure 22:
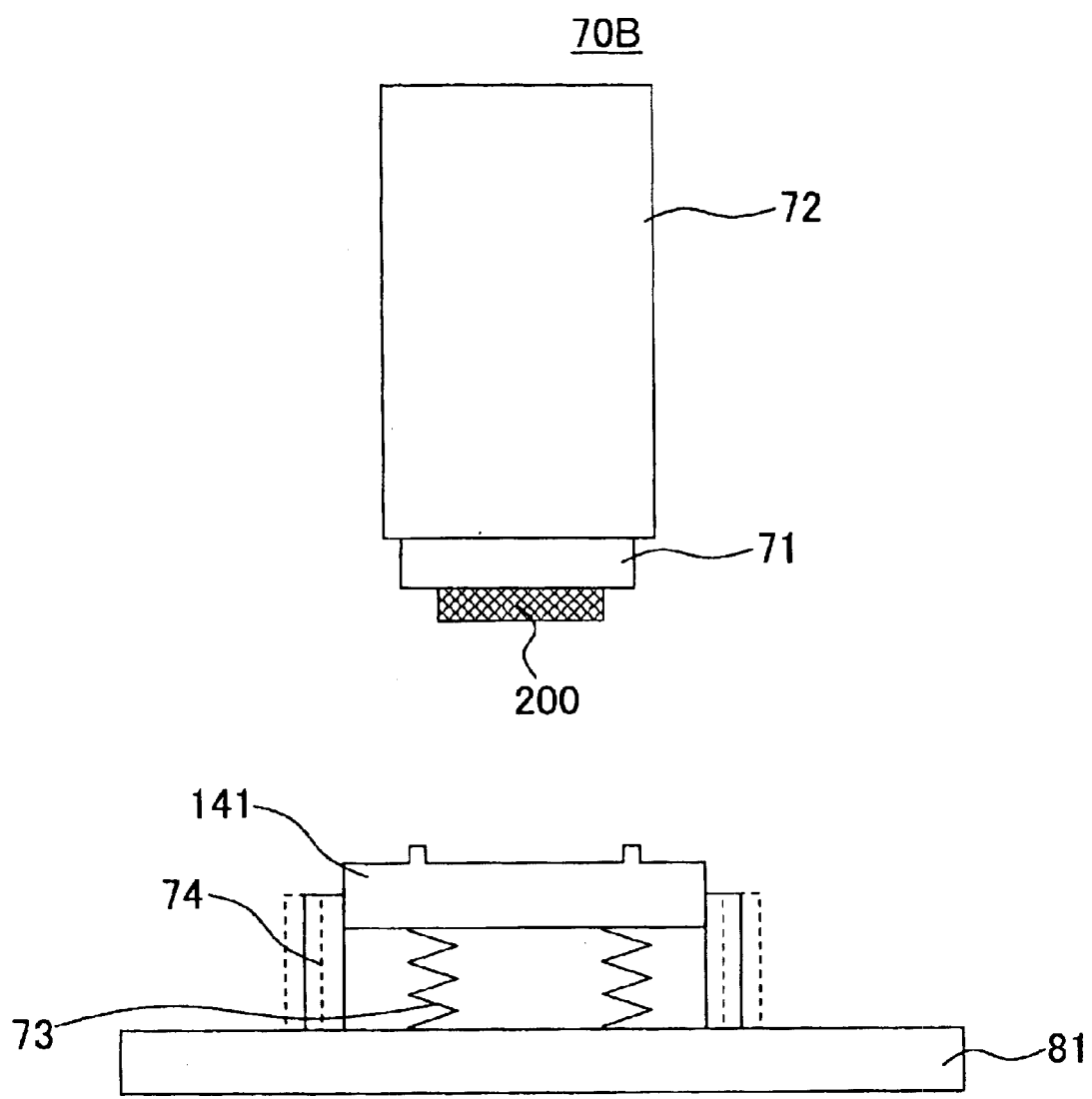
FIG. 22 illustrates a modification of the handling structure used in the carriage.

FIG. 22 illustrates an alternative of the handling structure of the present invention. In this alternative, the floating retainer 73 and the latch unit 74 are provided to the test unit (or the target), instead of to the carriage 70B. The target, that is, the socket 141 in this example, is retained on the stage 81 via the floating retainer 73 so as to be capable of displacing with respect to the stage 81. The latch unit 74 moves between the latched position indicated by the solid line and the unlatched position indicated by the dashed line. In the latched state, the target (i.e., the socket) 141 is secured with respect to the main unit 72 that moves toward the socket 141. When the object 200 held by the holder 71 is placed onto the socket 141, the socket 141 is released so as to flexibly position itself with respect to the object 200. Although, in the example shown in FIG. 22, the holder 71 is fixed to the main unit 72, it may be retained so as to be capable of displacing with respect to the main unit 72, as in the previous examples.

The floating retainer 73 is not limited to the compression coil spring shown in FIG. 22. Similarly, the latch unit 74 is not limited to the linearly movable latching members shown in FIG. 22. Other structures described above may be used even if the floating retainer 73 and the latched unit 74 are provided to the target side.

Although the present invention has been described based on preferred embodiments, the invention is not limited to the embodiments, and there are many modifications and substitutions that can be made without departing from the scope of the present invention.

For example, the carriage with the handling structure (which may be referred to as a "handling apparatus") is not limited to handling electronic components, but is applicable to handling and transporting food during a food processing process. The carriage with the handling structure described in the embodiment carries out positioning (including parallel-alignment), placing, and inserting an electronic component (i.e., an object) with respect to the socket (i.e., the target). However, the carriage does not have to carry out all of these operations, and it may carry out at least one of these operations.

This patent application is based on and claims the benefit of the earlier filing date of Japanese Patent Application No. 2002-158996 filed on May 31, 2002.

What is claimed is:

1. A handling apparatus comprising:
    a main unit;
    a holder configured to hold an object;
    a retainer configured to retain the holder so as to allow the holder to displace with respect to the main unit; and
    a latch unit configured to selectively bring the holder into a latched state, in which the displacement of the holder with respect to the main unit is restrained, and an unlatched state, in which the displacement of the holder with respect to the main unit is not restrained.

2. The handing apparatus according to claim 1, wherein the retainer retains the holder so as to allow the holder to displace along X, Y and Z axes that are perpendicular to one another, one of the X, Y, and Z axes being consistent with a moving axis of the main unit, and to allow the holder to rotate about the moving axis.

3. The handling apparatus according to claim 1, wherein the retainer retains the holder so as to allow the holder to rotate about X, Y, and Z axes perpendicular to one another, one of the X, Y, and Z axes being consistent with a moving axis of the main unit.

4. The handling apparatus according to claim 2, wherein the retainer further allows the holder to rotate about the X, Y, and Z axes.

5. The handling apparatus according to claim 1, wherein the retainer utilizes at least one of a mechanical spring, a fluid, a porous elastic material, a gel, and magnetism.

6. The handling apparatus according to claim 1, wherein the holder is divided into multiple sections, each section being retained by the retainer with respect to the main unit.

7. The handling apparatus according to claim 1, wherein when the object is pressed against a target, the retainer produces a substantially uniform contact pressure between the object and the target over a contacting area.

8. The handing apparatus according to claim 1, wherein the retainer has a nonlinear spring characteristic.

9. The handling apparatus according to claim 1, wherein the holder has a permanent magnet fixed to it, and the retainer comprises an electromagnet that produces attraction and repulsion between the retainer and the holder.

10. The handling apparatus according to claim 9, wherein the permanent magnet and the electromagnet comprise the latch unit.

11. The handling apparatus according to claim 1, wherein the latch unit includes a latching member that is movable between a latched position, at which the latching member is engaged with the holder, and an unlatched position, at which the latching member is disengaged from the holder.

12. The handling apparatus according to claim 1, wherein the latched unit includes a latching member coupled to the main unit so as to be pivotable about a pivoting axis and forced toward a latched position, and a moment generator configured to generate a moment about the pivoting axis of the latching member, the moment causing the latching member to rotate opposed to the latched position.

13. The handling apparatus according to claim 11, wherein the latching member is coupled to the main unit so as to be pivotable about a pivoting axis and force toward the latched position, and the latch unit further includes a moment generator configured to generate a moment about the pivoting axis of the latching member, the moment causing the latching member to rotate opposed to the latched position.

14. The handling apparatus according to claim 12, wherein the moment generator produces the moment to rotate the latching member to the unlatched position opposed to the latched position when a distance between the object and a target becomes smaller than a predetermined value.

15. The handling apparatus according to claim 13, wherein the moment generator produces the moment to rotate the latching member to the unlatched position opposed to the latched position when a distance between the object and a target becomes smaller than a predetermined value.

16. The handling apparatus according to claim 1, further comprising a switching member configured to switch the latch unit between the latched state and the unlatched state based on at least one of a distance between the object and a target, an amount of motion of the main unit, a moving speed of the main unit, and an acceleration of the main unit.

17. The handling apparatus according to claim 16, wherein the moving speed of the main unit changes stepwise depending on the distance between the target and the object.

18. The handling apparatus according to claim 16, wherein the switching member switches the latch unit from the latched state to the unlatched state before the object comes into contact with the target.

19. A test set for testing an object comprising:
    a test unit configured to carry out a test for the object; and
    a handling structure for transporting the object to and positioning the object with respect to the test unit, the handling structure comprising a main unit, a holder that holds the object, a retainer that retains the holder so as to be displacable with respect to the main unit, a driving mechanism for driving the main unit to bring the object toward the test unit, and a latch unit that selectively switches the handling structure between a latched state, in which the displacement of the holder with respect to the main unit is restrained, and an unlatched state, in which the displacement of the holder with respect to the main unit is not restrained.

20. The test set according to claim 19, wherein the object is an electronic component, and the test unit includes a socket having a contact electrode to carry out an electric test of the electronic component.

21. The test set according to claim 20, wherein the contact electrode of the test unit has a maximum deformation less than 0.5 mm.

22. A test set for testing an object comprising:

a test unit configured to carry out a test for the object and comprising a target for receiving the object to be tested, a retainer for retaining a holder for holding the object so as to allow the holder to displace with respect to a test stage, and a latch unit selectively bringing the target into a latched state and an unlatched state; and a handling structure for transporting the object to and positioning the object with respect to the target, the handling structure comprising a main unit, a holder that holds the object, and a driving mechanism for driving the main unit toward the test unit.

23. A method for handling an object comprising the steps of:

holding and carrying the abject toward a target using a handling apparatus;

keeping the handling apparatus in a latched state while the object is carried under a first condition;

switching the handling apparatus to an unlatched state when a second condition is satisfied; and positioning the object with respect to the target with the handling apparatus in the unlatched state.

24. The method according to claim 23, wherein the second condition relates to a distance between the object and the target or a relative speed of the object with respect to the target.

25. The method according to claim 24, wherein the handling apparatus is switched to the unlatched state before the object comes into contact with the target.

\* \* \* \* \*